(12) United States Patent
Furnemont

(10) Patent No.: US 7,508,718 B2
(45) Date of Patent: Mar. 24, 2009

(54) METHOD FOR OPERATING A NON-VOLATILE CHARGE-TRAPPING MEMORY DEVICE AND METHOD FOR DETERMINING PROGRAMMING/ERASE CONDITIONS

(75) Inventor: Arnaud Adrien Furnemont, Philippeville (BE)

(73) Assignee: Interuniversitair Microelektronica Centrum (IMEC), Leuven (BE)

( * ) Notice: Subject to any disclaimer, the term of this patent is extended or adjusted under 35 U.S.C. 154(b) by 31 days.

(21) Appl. No.: 11/446,538

(22) Filed: Jun. 2, 2006

(65) Prior Publication Data

US 2006/0291287 A1  Dec. 28, 2006

Related U.S. Application Data

(60) Provisional application No. 60/704,859, filed on Aug. 1, 2005, provisional application No. 60/687,076, filed on Jun. 3, 2005.

(30) Foreign Application Priority Data

Oct. 14, 2005  (EP)  ................... 05109602

(51) Int. Cl.
 *G11C 11/34* (2006.01)
(52) U.S. Cl. ............................. 365/185.28; 365/185.14
(58) Field of Classification Search ............ 365/185.28, 365/185.14
See application file for complete search history.

(56) References Cited

U.S. PATENT DOCUMENTS

| | | | |
|---|---|---|---|
| 6,331,953 B1 | 12/2001 | Wang et al. ............. | 365/185.29 |
| 6,396,741 B1 | 5/2002 | Bloom et al. .......... | 365/185.22 |
| 6,490,204 B2 | 12/2002 | Bloom et al. | |
| 2001/0048614 A1 | 12/2001 | Bloom et al. | |
| 2003/0002345 A1 | 1/2003 | Dror et al. | |
| 2004/0027871 A1 | 2/2004 | Bloom et al. | |
| 2004/0222437 A1 | 11/2004 | Dror et al. | |
| 2005/0105333 A1* | 5/2005 | Park et al. .............. | 365/185.17 |
| 2005/0237815 A1* | 10/2005 | Lue et al. ............... | 365/185.28 |
| 2006/0050553 A1* | 3/2006 | Yeh ........................ | 365/185.01 |

FOREIGN PATENT DOCUMENTS

EP  1225596 B1  7/2002

OTHER PUBLICATIONS

International Search Report for 05109602.2-2210 dated May 15, 2006.
Sun et al., "Effects of CHE and CHISEL programming Operation on the Characteristics of SONOS Memory," 2004 IEEE, pp. 695-698.
Gu et al., "Investigation of Programmed Charge Lateral Spread in a Two-bit Storage Nitride Flash Memory Cell by Using a charge Pumping Technique," 2004 IEEE, 42$^{nd}$ Annual International Reliability Physics Symposium, Phoenis, 2004, pp. 639.

* cited by examiner

*Primary Examiner*—Huan Hoang
*Assistant Examiner*—Anthan T Tran
(74) *Attorney, Agent, or Firm*—McDonnell Boehnen Hulbert & Berghoff LLP

(57) ABSTRACT

A method for determining programming/erase conditions and a method for operating a charge-trapping semiconductor device are disclosed. Programming and erase conditions are determined such that a first net charge distribution variation profile, upon going from programmed to erased state, is substantially the opposite of a second net charge distribution variation profile, upon going from erased to programmed state.

7 Claims, 24 Drawing Sheets

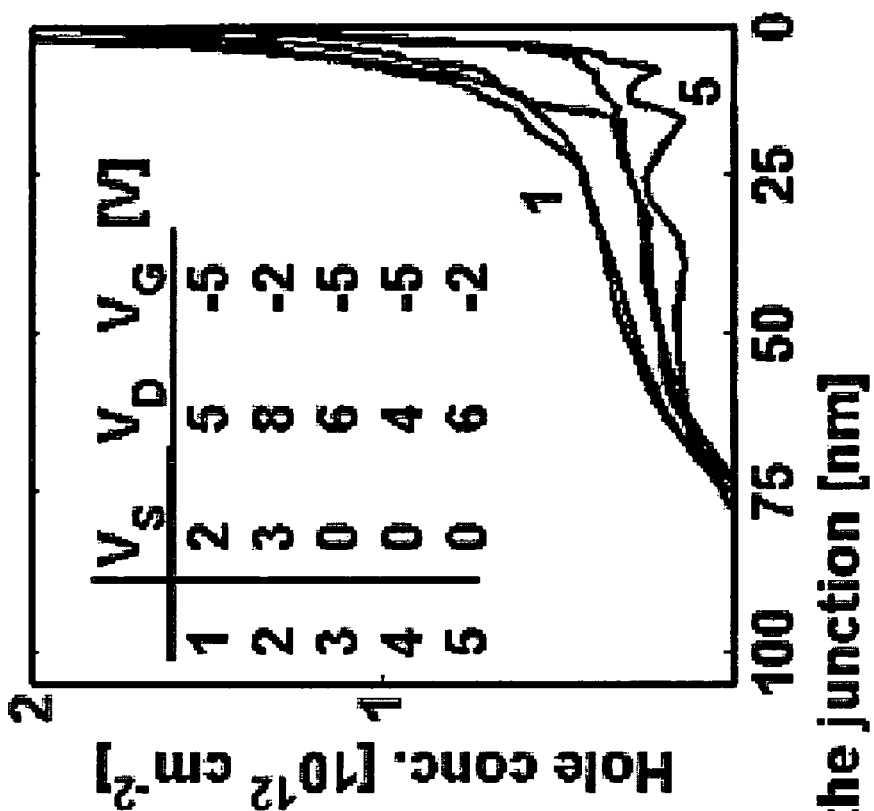
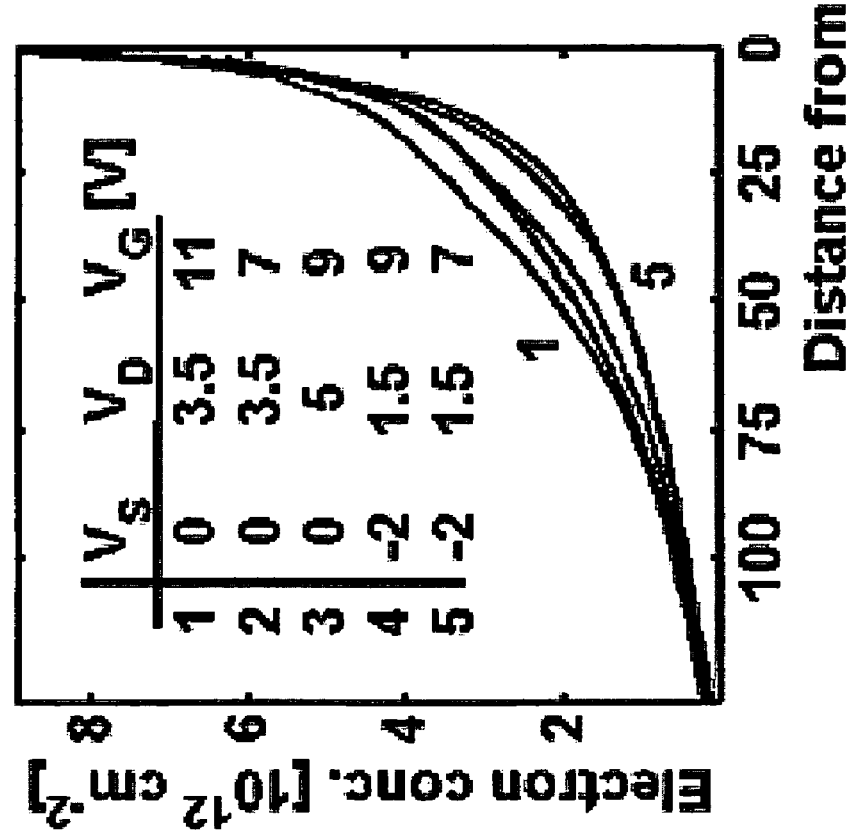
FIG. 11a
FIG. 11b

US 7,508,718 B2

METHOD FOR OPERATING A NON-VOLATILE CHARGE-TRAPPING MEMORY DEVICE AND METHOD FOR DETERMINING PROGRAMMING/ERASE CONDITIONS

The present application claims the priority of European Patent Application No. EP 05109602.2 (filed Oct. 14, 2005) and Provisional United States Application Nos. 60/704,859 (filed Aug. 1, 2005) and 60/687,076 (filed Jun. 3, 2005).

BACKGROUND

1. Technical Field

The present invention is in the field of semiconductor processing and devices, more specifically in the field of non-volatile charge-trapping memory devices. In particular, the present invention relates to a method for determining programming/erase conditions and a method for operating a non-volatile charge-trapping memory device.

2. Background Art

Non-volatile memories (NVM) are characterized by the fact that once a bit is stored in a memory cell this bit will be retained even when the memory cell is no longer powered. When electrical fields are used for erasing and programming of the memory cell, the NVM devices are also known as EEPROM (Electrically-Erasable-and-Programmable-Read-Only-Memory) devices. Whereas in floating gate EEPROM devices charge is stored in a conductive layer being part of a double-capacitor structure, in charge-trapping EEPROM devices charge is stored in a non-conductive layer being part of a single-capacitor structure. In such non-conductive charge-storage layer, e.g. nitride, oxide containing polysilicon nanocrystals or metal nanoparticles, the charge will not spread out uniformly over the whole of the charge-storage layer but will be confined substantially to the location where the charge was introduced into this non-conductive charge-storage layer. Charge-trapping memory devices are characterized by the presence of discrete charge traps as memory elements contrary to floating gate memory devices where a conductive layer is used as one continuous charge trap for storing charge. Developments in EEPROM devices are increasingly focused on localized charge trapping because it eases integration and reduces stress-induced-leakage. In particular NROM™ devices using nitride as non-conductive charge-storage layer as disclosed for example by B. Eitan in international application WO99/070000, are very attractive since they allow storage of two physical bits per memory cell, each bit at a different location in the nitride charge-storage layer. By injecting carriers, e.g. electrons, in the nitride layer the NROM™ cell is programmed. In order to erase the NROM™ cell opposite-type carriers are injected in the nitride layer as to compensate the charge stored during programming, e.g. holes are injected in the nitride layer to compensate the electrons already present. However, poor endurance and poor retention after cycling, i.e. repetitive programming and erasing of a cell, are major drawbacks of NROM™.

Hence there is a need to improve the endurance and charge retention characteristics of non-volatile charge-trapping memory devices, in particular of NROM™-type devices.

SUMMARY

According to a first aspect of the methods described herein, a set of programming and erase conditions for operating a non-volatile memory device comprising a charge-trapping layer is determined as follows. A set of programming and erase conditions is selected, the device is programmed and the spatial charge distribution is determined, resulting in a first spatial charge distribution. Then, the device is erased and again the spatial charge distribution of the charge trapping layer, resulting in a second spatial charge distribution. From the difference between the first and second spatial charge distributions, a first net charge distribution variation profile is obtained, which is the variation upon going from programmed to erased state. Then, the device is programmed again and a third spatial charge distribution is determined. From the difference between the second and third spatial charge distributions, a second net charge distribution variation profile is obtained, which is the variation upon going from erased to programmed state. Finally, it is checked if the second net charge distribution variation profile is substantially the opposite of the first net charge distribution variation profile. If this condition is met, there is substantially no variation in the spatial charge distribution of the charge-trapping layer in the programmed state and the set of programming and erase conditions is retained. If the condition is not met, the choice of programming and erase conditions is optimised and the whole process is repeated.

An analysis of the prior art has shown that programming and erase conditions are typically determined in view of keeping the threshold voltage window the non-volatile memory device flat. Up to now, the only way to achieve this was with adaptive cycling, meaning that the programming and erase conditions need to be adapted during the life of the non-volatile memory device as a result of changes in the spatial charge distribution in the programmed and erased states. More particularly, programming and erase voltages had to be increased over time to maintain the threshold voltage window flat.

With methods for determining programming and erase conditions as described herein, there should be substantially no change in the spatial charge distribution of the charge-trapping layer in programmed and erased states. The programming and erase conditions which are determined have to meet this requirement. As a result, there is no longer a need for adaptive cycling over the life of the device, since the threshold voltage window is maintained flat as a result of avoiding a change in the spatial charge distribution. Hence, the increase in the voltages can be avoided and power consumption can be reduced.

In a preferred embodiment, the first, second and third spatial charge distributions are determined by a charge pumping technique, comprising the following steps: Two charge pumping curves are determined, one by using a varying base-level voltage measurement and the other by using a varying top-level voltage measurement in the charge-pumping technique. More particularly, the first curve is determined by a first charge-pumping measurement on the semiconductor device whereby only the upper level of the charge-pump pulse is varied and the second curve is determined by a second charge-pumping measurement on the semiconductor device whereby only the lower level of the charge-pump pulse is varied. The data from the first and second charge-pumping measurements is combined to obtain the spatial distribution of the charge in the charge-trapping layer.

This combining of the data from the curves is done as follows. A relation is established between a charge pumping current $I_{cp}$ and a calculated channel length $L_{calc}$ of the semiconductor device by reconstructing a spatial charge distribution from the charge pumping curves for multiple values of the maximum charge pumping current $I_{cp}$. These values are preferably chosen in the upper range of the charge pumping curves, more preferably as close as possible to where one assumes the maximum charge pumping current $I_{cp\_max}$ to be, but this is not essential. From the multiple values of $I_{cp}$ that value is selected for which the corresponding calculated channel length $L_{calc}$ is substantially equal to the effective channel length $L_{eff}$ of the semiconductor device. Finally, the spatial charge distribution is reconstructed from the charge pumping curves using this value of $I_{cp}$.

The above described method for determining the first, second and third spatial charge distributions has the advantage that not only the spatial charge distribution of charge stored the charge-trapping layer can be extracted, but also the spatial charge distribution of charge stored in interface traps. In this way, the spatial distribution of both electrons and holes in the dielectric layer can be obtained. The thus obtained hole and electron distribution profiles are used for physical understanding and optimisation of the programming and erase conditions. However, the first, second and third spatial charge distributions may also be determined in any other way known to the person skilled in the art.

In a preferred embodiment, the combining of data from the charge pumping curves comprises the following steps. First, one value as charge pumping current $I_{cp}$ is selected on one of the charge pumping profiles. Next, the calculated channel length $L_{calc}$ corresponding to the selected charge pumping current $I_{cp}$ is determined by reconstructing the spatial charge distribution for this charge pumping current $I_{cp}$. Then, the calculated channel length $L_{calc}$ is compared with the effective length $L_{eff}$. In case of a mismatch, a new value for the charge pumping current $I_{cp}$ is determined, using the mismatch as information to improve the choice. These steps are repeated until the mismatch substantially becomes zero. Further aspects and advantages from this method for determining the first, second and third spatial charge distributions will appear from the detailed description given below.

In another embodiment, a non-volatile memory device comprising a charge-trapping layer is operated as follows. The non-volatile memory device is programmed by applying predetermined programming conditions, such that carriers of a first charge type are injected into the charge-trapping layer, resulting in a first net charge distribution variation profile. The non-volatile memory device is erased by applying predetermined erase conditions, such that carriers of a second charge type are injected into the charge-trapping layer, resulting in a second net charge distribution variation profile. These predetermined programming and erase conditions are chosen such that the first net charge distribution variation profile is substantially the opposite of the second net charge distribution variation profile.

According to this embodiment, programming and erase conditions are used for operating a non-volatile memory device, wherein there should be no change in the spatial charge distribution of the charge-trapping layer in programmed and erased states. As mentioned, this avoids the need for adaptive cycling over the life of the device, since the threshold voltage window is maintained flat as a result of avoiding a change in the spatial charge distribution. Hence, the increase in the voltages can be avoided and power consumption can be reduced.

As an alternative, it can be that upon programming carriers of a first charge type are injected into the charge-trapping layer and the state of the charge trapping layer is changed from an initial spatial charge distribution to a first spatial charge distribution, that upon erasing carriers of a second charge type are injected into the charge-trapping layer and the state of the charge trapping layer is changed from the first spatial charge distribution to a second spatial charge distribution, and that the predetermined programming and erase conditions are chosen such that the second spatial charge distribution is substantially equal to the initial spatial charge distribution.

Since it is a matter of convention whether either programming or erasing involves injection of positive or negative charge carriers, i.e. electrons or holes, the wording "charge carriers of a first/second type" is used. The first type can be electrons and the second type can be holes, or vice versa.

In case the first type carriers are electrons, it is preferred that the predetermined programming conditions are chosen such that secondary electron injection is suppressed. It has been found that this is a convenient way to obtain the requirement that the first and second net charge distribution variation profiles are each other's opposite. The suppression of secondary electron injection can for example be achieved by means of a predetermined voltage difference between the drain and the substrate of the non-volatile memory device.

Of course, the predetermined programming and erase conditions are preferably determined by means of the method according to the techniques described above. However, other methods are feasible.

The above described technology may be applied to a memory circuit. Such a memory circuit comprises a matrix of charge trapping memory devices, each device comprising a substrate in which a source, a drain and a channel are applied, the channel extending between the source and the drain and underneath a charge trapping layer, the circuit further comprising peripheral circuitry for applying programming and erase conditions to each of the charge trapping memory devices, which in turn comprises means for forward biasing the source junction of each of the memory devices upon applying the programming conditions.

BRIEF DESCRIPTION OF THE DRAWINGS

Exemplary embodiments are illustrated in referenced figures of the drawings. It is intended that the embodiments and figures disclosed herein be considered illustrative rather than restrictive.

FIGS. 11a-b shows a) electron profiles and b) hole profiles extracted for different program and erase conditions according.

DETAILED DESCRIPTION

Figure 1A:
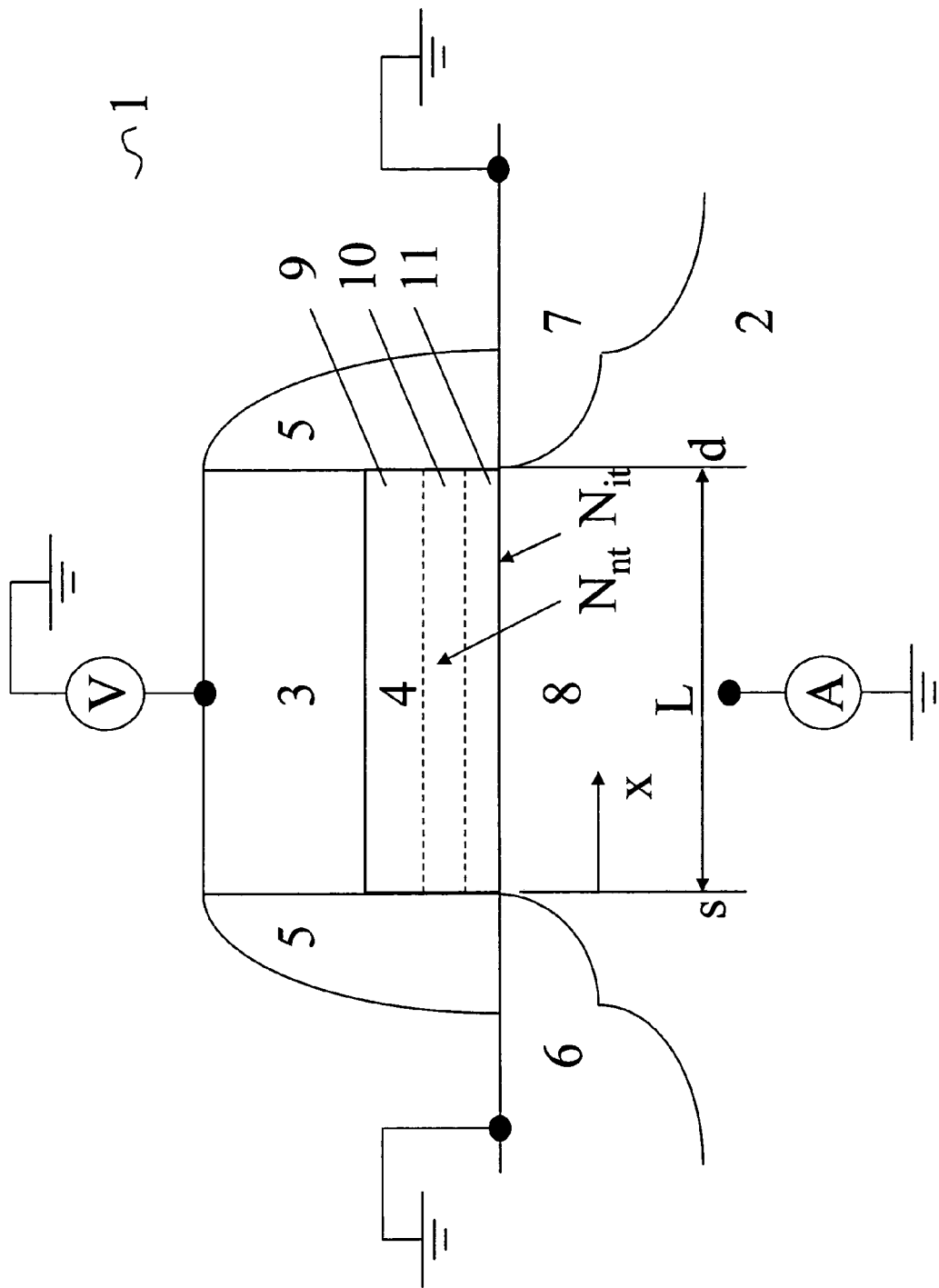
FIGS. 1a-e show (a) a schematic cross-section of a measurement set-up for performing charge-pumping measurement of a charge-trapping semiconductor device, (b) a first pulse sequence and (c) the resulting charge-pump curve, (d) a second pulse sequence and (e) the resulting charge-pump curve.

As described with reference to FIG. 1-8, a set of programming and erase conditions for operating a semiconductor device, preferably a non-volatile memory device comprising a charge-trapping layer, is determined.

FIG. 1 shows a schematic cross-section of such a semiconductor device, namely a MOSFET-type device. This device (1) comprises a gate electrode (3) separated from the substrate (2) by a gate dielectric (4). Typically the gate electrode is formed from a semiconductor material such as polycrystalline silicon doped to obtain the desired workfunction and/or conductivity. This semiconductor material can be partially or fully silicided as known in the art or even metals, e.g. Al, TiN, TaN, are used. The gate dielectric (8) comprises a dielectric charge-trapping layer (10) such as silicon-nitride, silicon-rich oxide, silicon-oxynitride, an oxide layer comprising nanocrystals of a semiconductor material, e.g. polycrystalline silicon. Optionally this charge-trapping layer can be separated from the substrate (2) by another dielectric layer (11) with low or no trapping capabilities, e.g. silicon-oxide. Another layer (9) in a similar material as layer (11) can be used to separate the charge-trapping layer (10) from the gate electrode (3). The substrate (2) is a semiconductor substrate, e.g. silicon, silicon-on-insulator (SOI), germanium-on-insulator (GOI). Adjacent to the stack of gate electrode (3) and gate dielectric (4) sidewall spacers (5) formed in a dielectric material such as silicon-oxide, silicon-oxynitride, silicon-carbide, can be present. Aligned to this stack source (6) and drain regions (7) are formed in the substrate (2). The source (6) and drain regions (7) are of an opposite conductivity type as the substrate (2). The source (6) and drain regions (7) extend under the spacers (5) such that the channel region (8) is contacted. This channel region (8) is under dielectric control of the gate electrode (3). The device of FIG. 1a can be manufactured using processing steps and materials known to those skilled in the art of manufacturing semiconductor devices, in particular non-volatile memory devices.

For the purpose of the present disclosure, it is assumed that the device (1) is a nMOS device comprising a polysilicon gate electrode (3), which is n-type doped. Also source (6) and drain (7) regions are n-type doped while the substrate (2) is p-type doped. Sidewall spacers (5) formed in silicon-oxide are present. The gate dielectric (4) consists of a nitride layer used as charge-trapping layer (10) sandwiched between two layers (9, 11) of silicon-oxide. However the invention is not limited to this example. It will be appreciated that there are numerous variations and modifications possible. The device can be, for example, a pMOS device comprising device comprising a polysilicon gate electrode (3), which is p-type doped. Also source (6) and drain (7) regions are p-type doped while the substrate (2) is n-type doped. Instead of being a stacked gate device as shown in FIG. 1a the device can be a split gate device such as the HIMOS memory cell disclosed in U.S. Pat. No. 5,583,811 hereby incorporated by reference in its entirety. Accordingly, the description should not be deemed to be limiting in scope.

A set of programming and erase conditions may be determined as follows. A set of programming and erase conditions is selected, the device is programmed and the spatial charge distribution is determined, resulting in a first spatial charge distribution. Then, the device is erased and again the spatial charge distribution of the charge trapping layer, resulting in a second spatial charge distribution. From the difference between the first and second spatial charge distributions, a first net charge distribution variation profile is obtained, which is the variation upon going from programmed to erased state. Then, the device is programmed again and a third spatial charge distribution is determined. From the difference between the second and third spatial charge distributions, a second net charge distribution variation profile is obtained, which is the variation upon going from erased to programmed state. Finally, it is checked if the second net charge distribution variation profile is substantially the opposite of the first net charge distribution variation profile. If this condition is met, there is substantially no variation in the spatial charge distribution of the charge-trapping layer in the programmed state and the set of programming and erase conditions is retained. If the condition is not met, the choice of programming and erase conditions is optimised and the whole process is repeated.

The first, second and third spatial charge distributions are preferably determined by means of the extraction method which will be described below. However, other means for determining the spatial charge distributions may also be used.

The extraction method described here enables one to separately extract the spatial distribution of charges within a charge-trapping layer of a charge-trapping device and traps situated at the interface of this layer. In this way, the spatial distribution of both electrons and holes in the dielectric layer can be obtained. The thus obtained hole and electron distribution profiles are used for physical understanding and optimisation of the programming and erase conditions.

In general, methods for extracting the spatial distribution of charge $N_{nt}$ stored in the charge-trapping layer (10) of the semiconductor device (1) which are discussed below comprise the following steps: determining a varying base-level voltage $V_{base}$ charge pumping curve, determining a varying top-level voltage $V_{top}$ charge pumping curve, and combining data from the charge pumping curves to obtain the spatial distribution of the stored charge $N_{nt}$. This combination of data is done by establishing a relation between a charge pumping current $I_{cp}$ and a calculated channel length $L_{calc}$ of the semiconductor device by reconstructing a spatial charge distribution from the charge pumping curves for multiple values of the charge pumping current $I_{cp}$. From these multiple values of $I_{cp}$ the value is obtained for which the corresponding calculated channel length $L_{calc}$ is substantially equal to the effective channel length $L_{eff}$ of the semiconductor device, this charge pumping current $I_{cp}$ being the maximum charge pumping current $I_{c\_max}$. Finally the spatial distribution $N_{nt}$ of the charge is extracted by reconstructing the spatial charge distribution from the charge pumping curves using the value of $I_{cp}=I_{cp\_max}$.

In the embodiments described below, separately the spatial distribution of charges within a charge-trapping layer of a charge-trapping device and traps situated at the interface of this layer is extracted. Preferably this charge-trapping device is a non-volatile charge-trapping memory device.

A charge-pumping measurement set-up, which can be used in for determining the charge pumping curves, is schematically shown in FIG. 1a. Source (6), drain (7) and substrate (2) regions are biased to a fixed voltage, preferably 0V or ground. A voltage source, e.g. a pulse generator, is connected to the gate electrode while current is measured at the substrate. This measurement set-up is also known as amplitude-sweep charge-pumping set-up as the amplitude of the voltage pulses applied to the gate electrode is increased during the measurement.

In the embodiment described below, the measurement sequence comprises two steps: first two charge-pumping measurements are performed on a device used as reference and secondly similar charge-pumping measurements are performed on the device-under-test (DUT).

Figure 2:
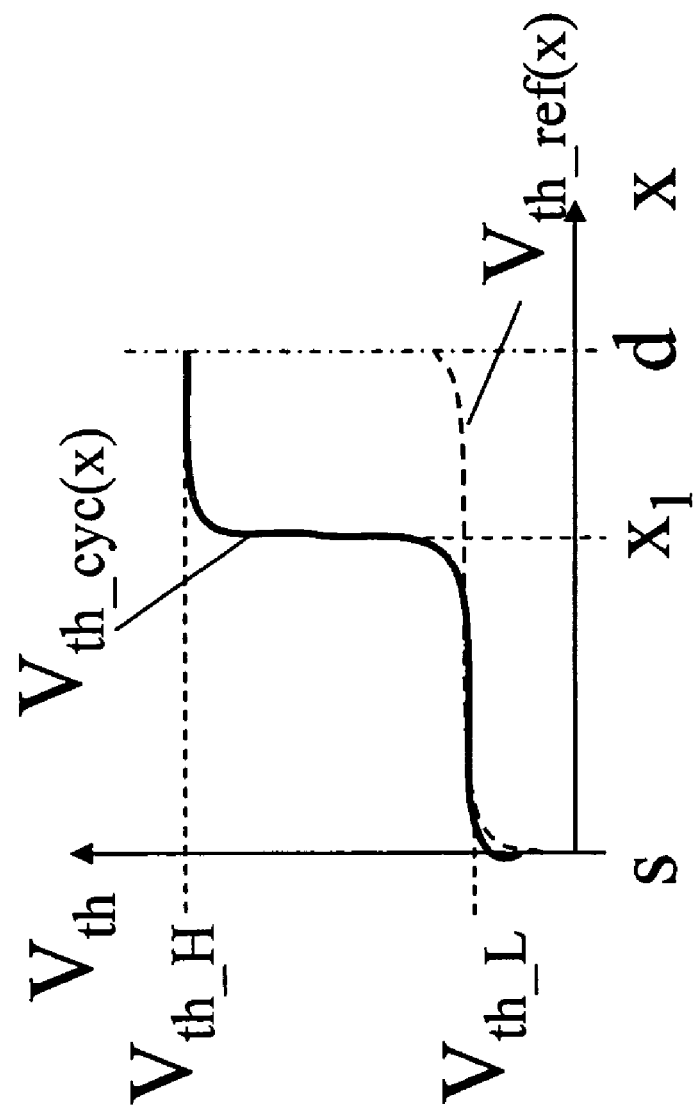
FIG. 2 shows the variation of the threshold voltage along the channel of a programmed charge-trapping semiconductor device.

The reference device is usually the same as the studied device but in a reference state. The studied device has a monotonic increase or decrease of the threshold voltage along the channel, or at least along the part of the channel, which is subjected to the measurement method, typically half of the channel. In this case, each threshold voltage value corresponds to one point of the charge-pumping curve. The reference state of this device, more precisely the threshold voltage distribution thereof depends on the charge already trapped in the studied device. If the threshold voltage distribution in the studied device increases monotonically, it is better to have the reference state having a similar increase in threshold voltage distribution. For instance, the pristine device can be subjected to a light programming operation resulting in a monotonic increase of the charge in the charge-trapping layer which results in a threshold profile $V_{th}(x)$ that monotonic varies along the channel as shown in FIG. 2 by the dotted line $V_{th\_ref}(x)$. In this figure the threshold voltage of the device in the reference state slightly increase near the drain d. The number and distribution of the interface traps should remain essentially unaffected and essentially uniform over the channel. If the threshold voltage distribution monotonically decreases, it is better to have the reference state with also a decreasing threshold voltage distribution. The most natural reference state is in this case the virgin device, where the threshold voltage progressively decreases from the center of the channel to the junction.

Figure 1B:
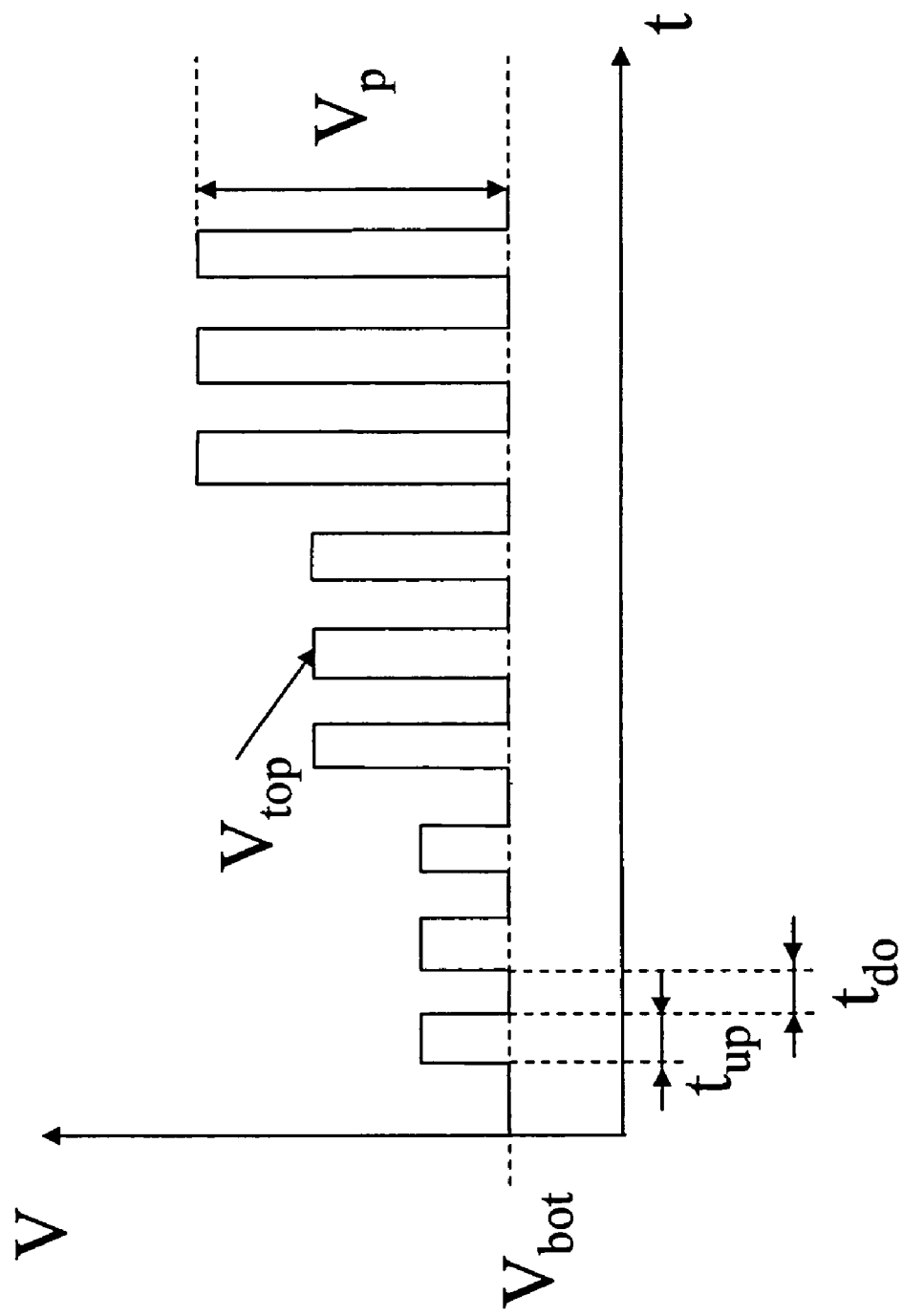
Figure 1C:
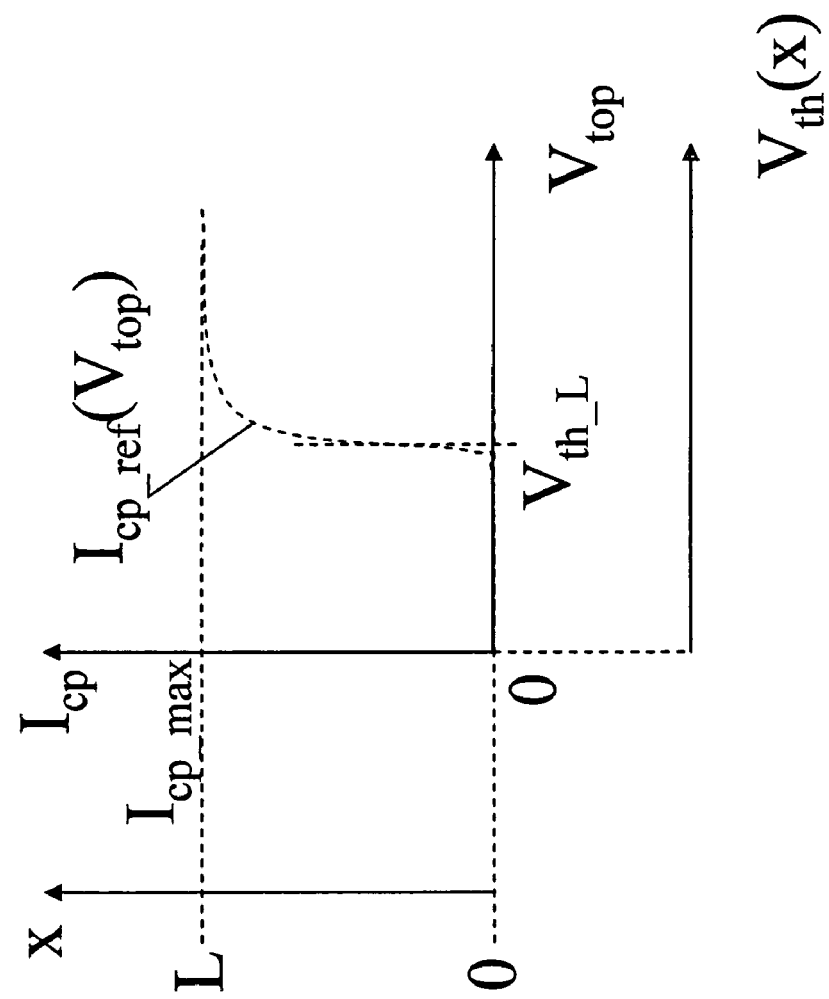
Figure 1D:
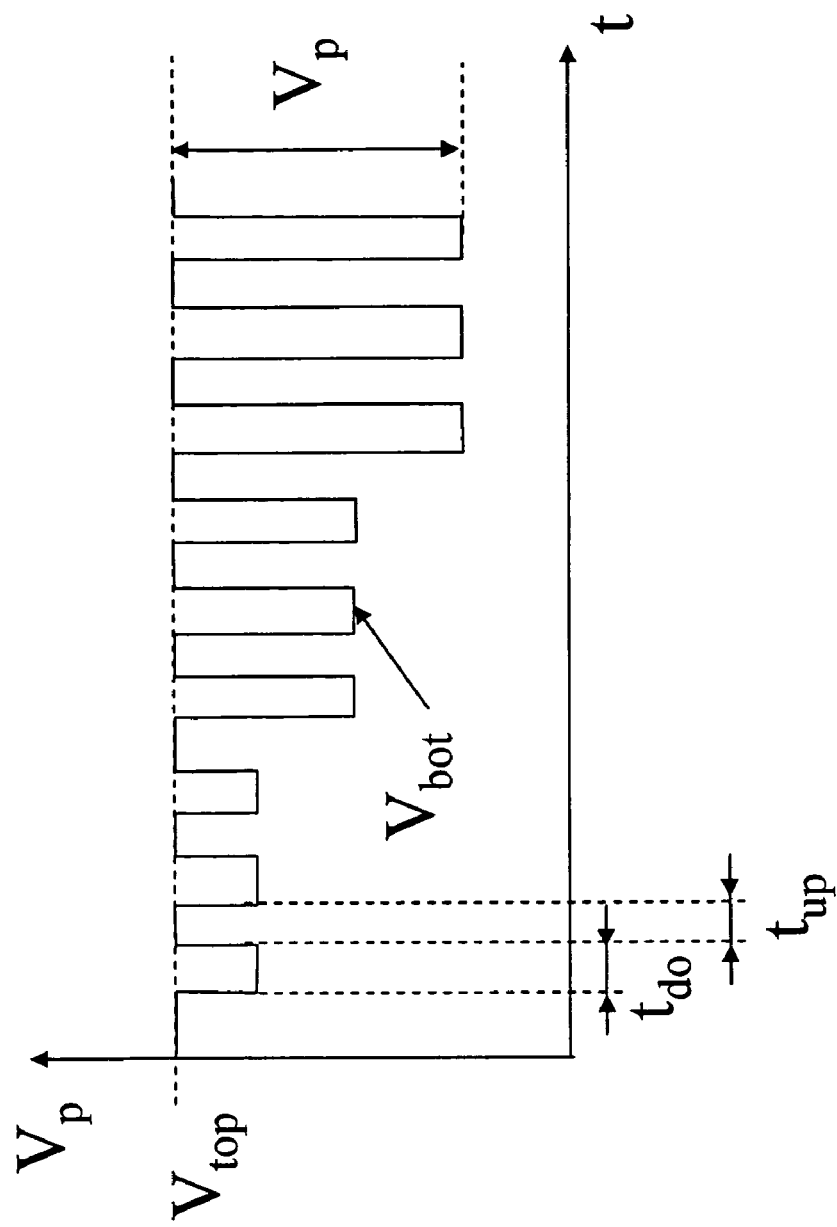

A first charge-pumping measurement, illustrated by FIG. 1b and 1c, is performed on the device in the reference state that has not yet been electrically stressed, i.e. the interface trap distribution can be considered uniform along the channel. A first pulse train is applied to the gate electrode (3), whereby each pulse in this pulse train has the same bottom-level $V_{bot}$. The amplitude $V_p$ of the pulses increases monotonically with time by increasing the top-level $V_{top}$ of the pulses. The exemplary pulse train shown in FIG. 1b comprises 9 pulses grouped in sets of 3. The pulses in the first set have the lowest amplitude, the pulses in the second set have a higher amplitude, while the pulses in the last set have the highest amplitude. So the amplitude of the pulse in the pulse sequence or the voltage swing of each pulse increases progressively. The number of pulses in the pulse train, their duty cycle, the amplitude of each pulse, the way the amplitude $V_p$ is increased over the pulse train, e.g. stepwise, gradually, and the upper level $V_{top}$ are parameters of choice and can be selected in view of the required accuracy and measurement resolution.

When the bottom level of the pulse $V_{bot}$ is below the flatband voltage $V_{fb\_H}$ of the device (1) and the upper level of the pulse $V_{top}$ is above the threshold voltage $V_{th\_L}$ of the device (1) accumulation and inversion layers will be successively formed at the interface between the channel (8) and the gate dielectric (4). Inversion layer electrons from the source (6) and/or drain (7) regions will fill the interface states $N_{it}$ during the high pulse bias. These interface states thus become negatively charged. When the voltage is dropped below the flatband voltage $V_{fb\_ref}(X)$, accumulation layer holes from the substrate (2) will quickly recombine with the trapped electrons resulting in a charge-pump current $I_{cp}$. The charge-pump current is proportional to the pulse frequency and the number of interface states $N_{it}$ in the inversion region formed in the channel. From this charge-pumping measurement the charge-pump curve $I_{cp}(V_p)$ of this device in the reference state is obtained as shown in FIG. 1c given the current $I_{cp}$ or charge per pulse as function of the top level $V_{top}$ of the pulse train. One can change the vertical axis of this curve by replacing $I_{cp}$ with the position x along the channel: no current corresponds to one end of the channel, e.g. source where x=0, while the maximum $I_{cp\_max}$ current corresponds to the other end of the channel, e.g. drain where x=100%= channel effective length $L_{eff}$. By rearranging this charge-pumping curve by using the method disclosed by Maarten Rosmeulen et al in paragraph 3.3 of "Characterization of the spatial charge distribution in local charge-trapping memory devices using the charge-pumping technique", Solid-State Electronics journal, volume 48 (2004) p 1525-1530, hereby incorporated by reference, a threshold profile curve $V_{th,ref}(X)$ is obtained showing the change of voltage applied to this device as function of its relative position x with respect to source and drain.

Figure 1E:
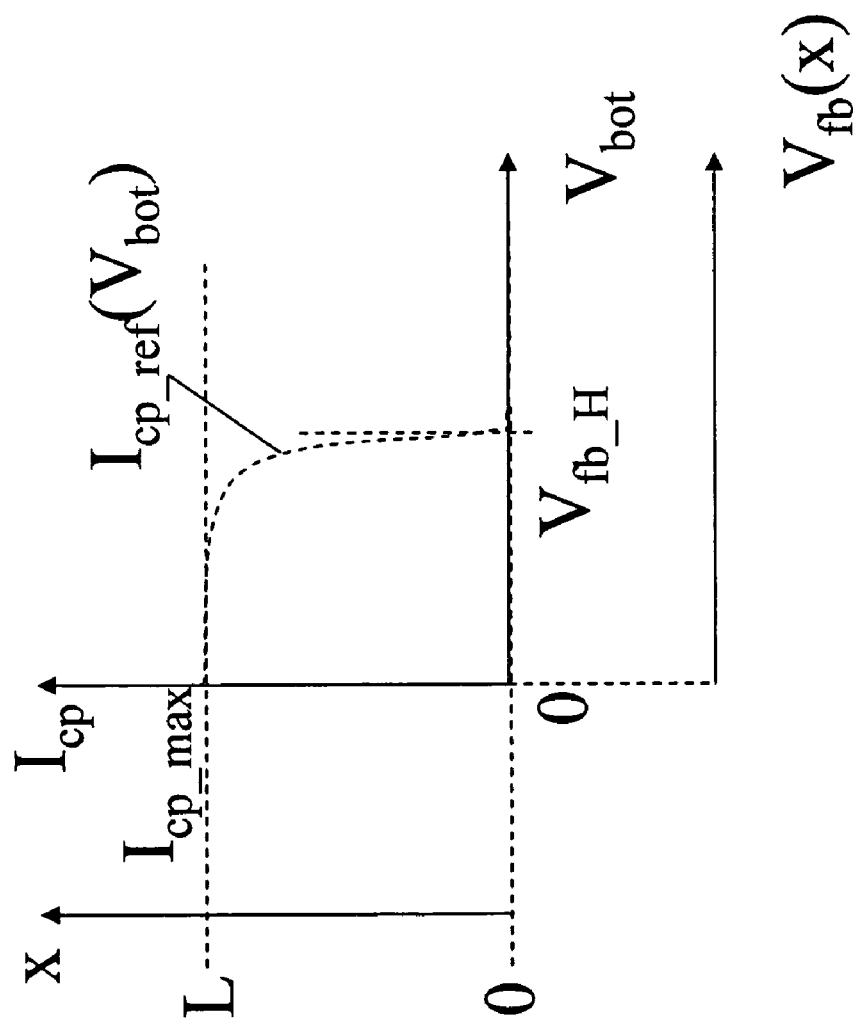

A second charge-pumping measurement is performed on the device in the reference state. A pulse train is applied to the gate electrode (3), whereby each pulse in this pulse train has the same top-level $V_{top}$. The amplitude $V_p$ of the pulses increases monotonically with time by lowering the bottom-level $V_{bot}$ of the pulses. The exemplary pulse train shown in FIG. 1d comprises 9 pulses grouped in sets of 3. The pulses in the first set have the lowest amplitude or voltage swing, the pulses in the second set have a higher amplitude, while the pulses in the last set have the highest amplitude. The number of pulses in the pulse train, their duty cycle, the amplitude of each pulse, the way the amplitude $V_p$ is increased over the pulse train, e.g. stepwise, gradually, the upper level $V_{top}$ are parameters of choice and can be selected in view of the required accuracy and measurement resolution. This pulse train with fixed toplevel $V_{top}$ and varying bottom-level $V_{bot}$ will fill the interface states with electrons during the uptime $t_{up}$ of the pulse and with holes during the downtime $t_{do}$ of the pulse when $V_{bot}$ is below the flatband voltage $V_{fb\_H}$. As long as the lower level $V_{bot}$ of the pulse is above the flatband voltage $V_{fb\_H}$, the channel will remain in inversion and the interface traps are always filled with electrons. The channel (8) will switch between inversion and accumulation depending on whether the lower level $V_{bot}$ of the progressively increased pulse amplitude is above or below this flatband voltage $V_{fb\_H}$ and the interface traps will be alternatively filled with electrons and holes during the charge-pumping measurements. From this charge-pumping measurement the charge-pump curve $I_{cp}(V_p)$ of this device in the reference state is obtained as shown in FIG. 1e given the current $I_{cp}$ or charge per pulse as function of the bottom level $V_{bot}$ of the pulse train. One can change the vertical axis of this curve by replacing $I_{cp}$ with the position x along the channel: the maximum $I_{cp\_max}$ current corresponds to one end of the channel, e.g. source where x=0, while no current corresponds to the other end of the channel, e.g. drain where x=100%= channel effective length $L_{eff}$. By rearranging this charge-pumping curve by using the method disclosed by Maarten Rosmeulen et al in paragraph 3.3 of "Characterization of the spatial charge distribution in local charge-trapping memory devices using the charge-pumping technique", in Solid-State Electronics journal, volume 48 (2004) p 1525-1530, hereby incorporated by reference, a flatband profile curve $V_{fb,ref}(x)$ is obtained showing the change of voltage applied to this device as function of its relative position x with respect to source and drain.

A device under test is electrically stressed resulting in charged carriers to be injected into the charge-trapping layer (10). These injected carriers can be positively or negatively charged. In case the device is used as memory cell, one carrier type is used to program the memory cell while the opposite charged carriers are used to erase the memory cell by compensating the distribution profile of the programmed charge. On this device charge-pumping measurements are performed to determine the contribution to the threshold voltage of the charge $Q_{nt}$ stored in the charge-trapping layer (10) and the charge $Q_{it}$ generated by the interface traps $N_{it}$. The charge $Q_{nt}$ stored in the charge-trapping layer (10) generates a constant offset of the threshold voltage $\Delta V_{th\_Qnt}$, while the offset $\Delta V_{th\_Qit}$ generated by the charge stored in the interface traps depends on whether positive or negative charge is stored in these interface traps and on the number of interface traps $N_{it}$. In inversion the interface traps are filled with electrons causing an upward shift of the threshold voltage, while in accumulation the interface traps are filled with holes causing a downward shift of the threshold voltage. The degradation of a device, e.g. by repetitive electrical stress applied to the device, will change the number of interface traps and hence the threshold voltage offset $\Delta V_{th\_Qit}$. A threshold voltage distribution shown in FIG. 2 can result from negative charge e.g. present in the charge-trapping layer (10) of an nMOS device. A similar Figure can be drawn for the flatband voltage distribution of this device. If the device of FIG. 1 is used as non-volatile memory cell, electrons can be injected into this layer (10) during the step of programming the memory cell, e.g. by channel-hot-electron-injection as is known in the art. Holes can be injected during the step of erasing the memory cell, e.g. by band-to-band tunneling induced hot hole injection as is known in the art. This localized trapped charge, e.g. in the region between $x_1$–d, will result in a local increase $V_{th\_ref}(X)-V_{th\_cyc}(x)$ of the threshold voltage and of the flatband voltage $V_{fb\_ref}(X)-V_{fb\_cyc}(X)$. For the purpose of the present description, it assumed that negative charge $Q_{nt}$ is stored in the charge-trapping layer (10) of an nMOS memory cell (1) resulting in positive shift of the threshold voltage and the flatband voltage, i.e. the threshold voltage and flatband voltage become more positive in these locations where the negative charge $Q_{nt}$ is stored. In real devices the threshold voltage distribution along the channel will is not sharply define as suggested in FIG. 2 but will vary along the channel due to the presence of the junctions and of amongst other the interface traps $N_{it}$ which are distributed along the channel.

Figure 3A:
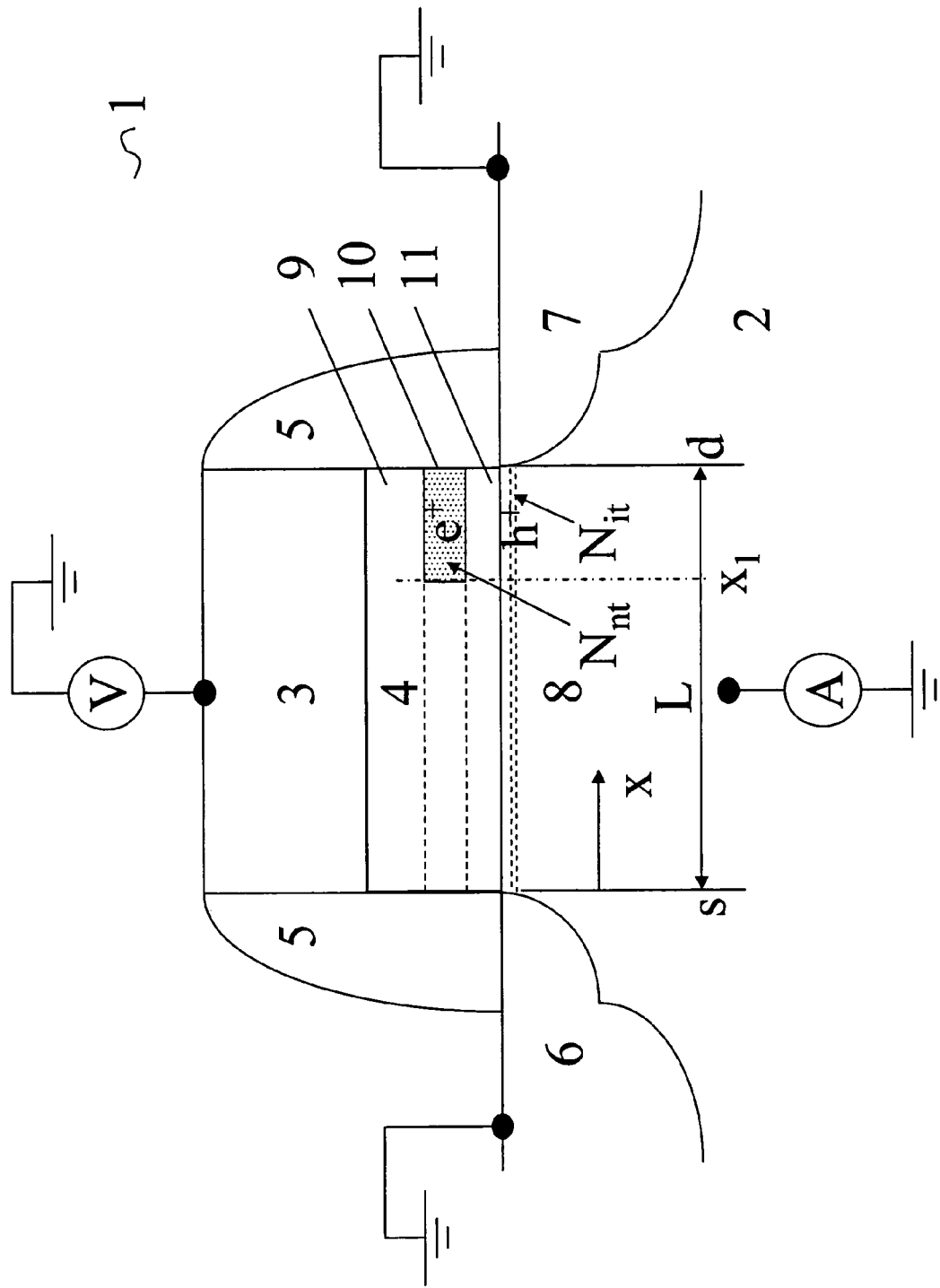
FIGS. 3a-c include a schematic cross section of a semiconductor device with accompanying graphs illustrating electrical properties of the device.
Figure 3B:
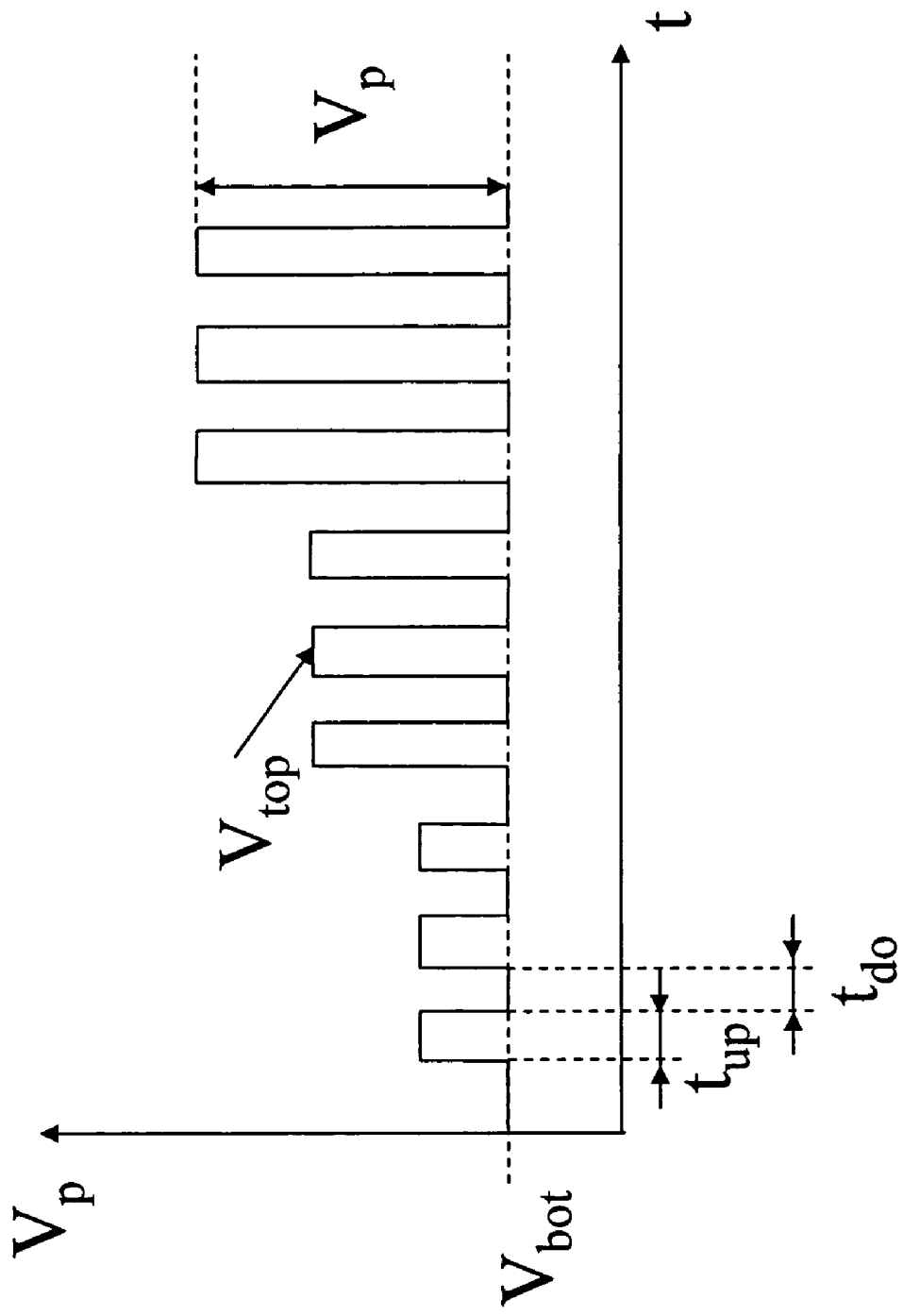
Figure 3C:
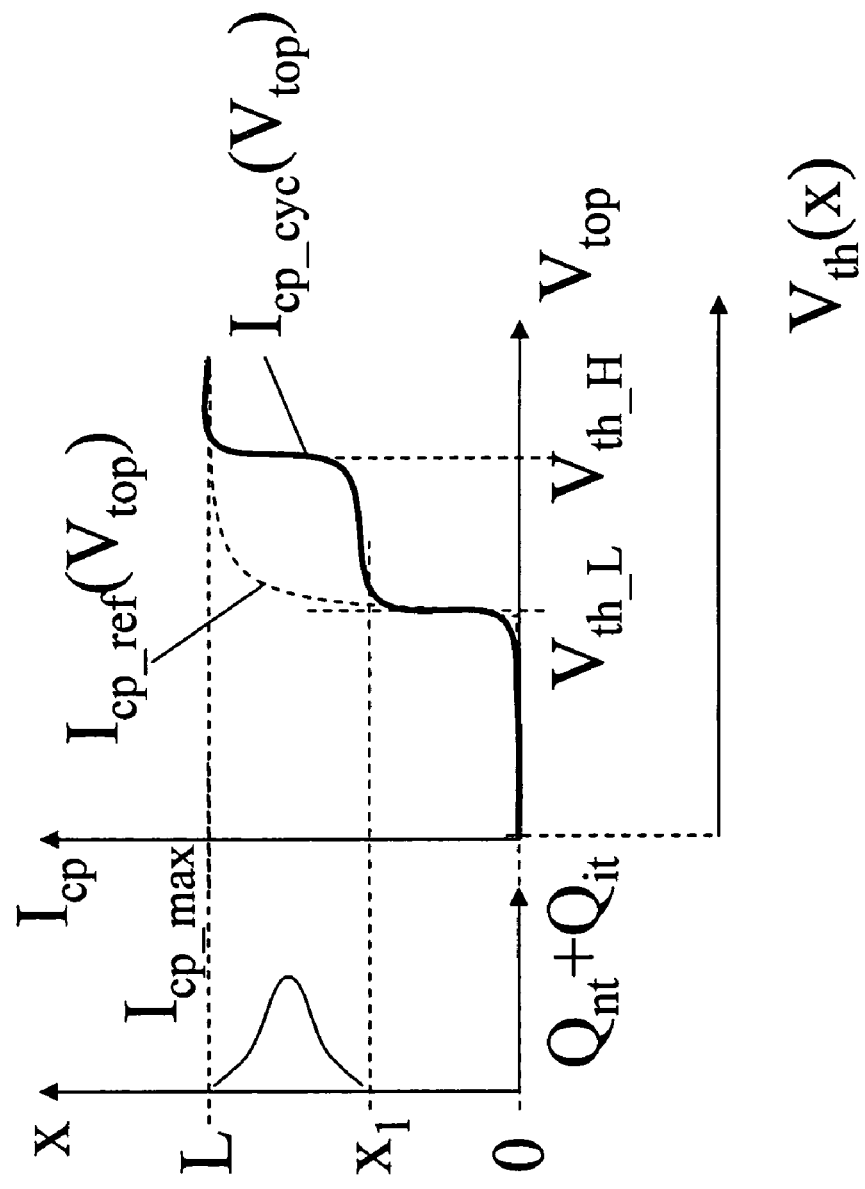

A first charge-pumping measurement is performed on the device under test. FIG. 3a illustrates such a device wherein a number $N_{nt}$ of negative charged particles (dotted area between position $x_1$ and drain d) is stored in the charge-trapping layer (10) resulting in an increase of the threshold voltage and flatband voltage in the portion $x_1$ to d compared to the portion s to $x_1$. A number of interface states $N_{it}$ are present (dots in the channel). A pulse train similar to the pulse train of the first measurement on the device in the reference state and illustrated by FIG. 3b is applied to this device also. As discussed in the first step when measuring the reference device, this pulse train with fixed bottom-level $V_{bot}$ and varying top-level $V_{top}$ will fill the interface states with electrons during the uptime $t_{up}$ of the pulse and with holes during the downtime $t_{do}$ of the pulse in these locations where the pulse is swept over the corresponding threshold voltage. If the number of interface states or the threshold voltage were uniform over the channel (8), one would obtain the same charge-pump current at each pulse independently of the amplitude of the pulse as long as $V_{top}$ is higher than the threshold voltage $V_{th}$. If however the threshold voltage is not constant over the channel, as shown in FIG. 2, with increasing pulse amplitude $V_p$ an increasing portion of the channel will contribute to the charge pump current. As long as the upper level $V_{top}$ of the pulse is lower than the local threshold voltage $V_{th\_H}$ the portion of the channel between $x_1$ and d will not contribute to the charge-pumping current. Until then the portion of channel (8) having the higher threshold voltage $V_{th\_H}$ will remain in accumulation and the corresponding interface traps will be always filled with holes as shown in FIG. 3a by the symbol h⁺. The portion of the channel (8) having the lower threshold voltage $V_{th\_L}$ will switch between inversion and accumulation depending on whether the upper level $V_{top}$ is above or below this lower threshold voltage and the corresponding interface traps will be alternatively filled with electrons and holes during the charge-pumping measurement. If the pulse sequence of FIG. 3b is applied to the device of FIG. 3a the channel is scanned from source to drain if the threshold voltage $V_{th}(x)$ increases monotonically from the source to the drain. If only half of the channel is degraded, $V_{th}(x)$ needs to be monotonic only on half of the channel. The same procedure as applied to the charge-pumping signal in the first step for extracting the threshold voltage profile $V_{th}(x)$ from the charge-pumping current for the device under test is applied to this stressed device as illustrated by FIG. 3c. A relationship between the threshold voltage profile $V_{th}(x)$ and the location x in the channel can be established by the fact that the increase of the charge-pump current $I_{cp}$ from one location $x_1$ in the channel to another location $x_2$ can be attributed to the number of interface traps $N_{it}$ present in the channel area between these location. This relationship is expressed as follows:

$$\int_{x_1}^{x_2} qfN_{it}(x)dx \approx I_{cp}(V_{th}(x_2)) - I_{cp}(V_{th}(x_1)) \quad [1]$$

with q the absolute value of the electron charge, f the frequency of the pulse. In this figure the dotted line indicates the reference charge-pump curve while the solid line indicates the charge-pumping curve obtained on the stressed device. The deviation between both charge-pump curves and hence in the corresponding threshold voltages is induced by the total charge $(Q_{nt}+Q_{it})$ present, for each point x along the channel, as expressed in the following formula:

$$\Delta V_{th}(x) = V_{th\_ref}(x) - V_{th\_cyc}(x) = \frac{\Delta Q_{nt}(x) - \Delta Q_{it}(x)}{2C} = \frac{q\Delta N_{nt}(x) - q\Delta N_{it}(x)}{2C} \quad [2]$$

with C the capacitance of the dielectric stack (F/cm²), q the absolute value of the electron charge. The concentration of charge in the charge-storage layer $N_{nt}(x)$ (#/cm²) is positive if electrons are trapped, while the local concentration of interface traps $N_{it}(x)$ is also in (#/cm²). By varying the top level of the voltage applied on the gate as described in this paragraph classical charge-pumping curves are obtained as is known by a person skilled in the art. During this charge-pumping measurement the threshold voltage and flatband voltage at any given point is determined by the charge at that point: electrons stored in the charge-trapping layer (10) and the holes trapped in the interface states. The shift in threshold voltage is indicated in FIG. 3c.

Figure 4A:
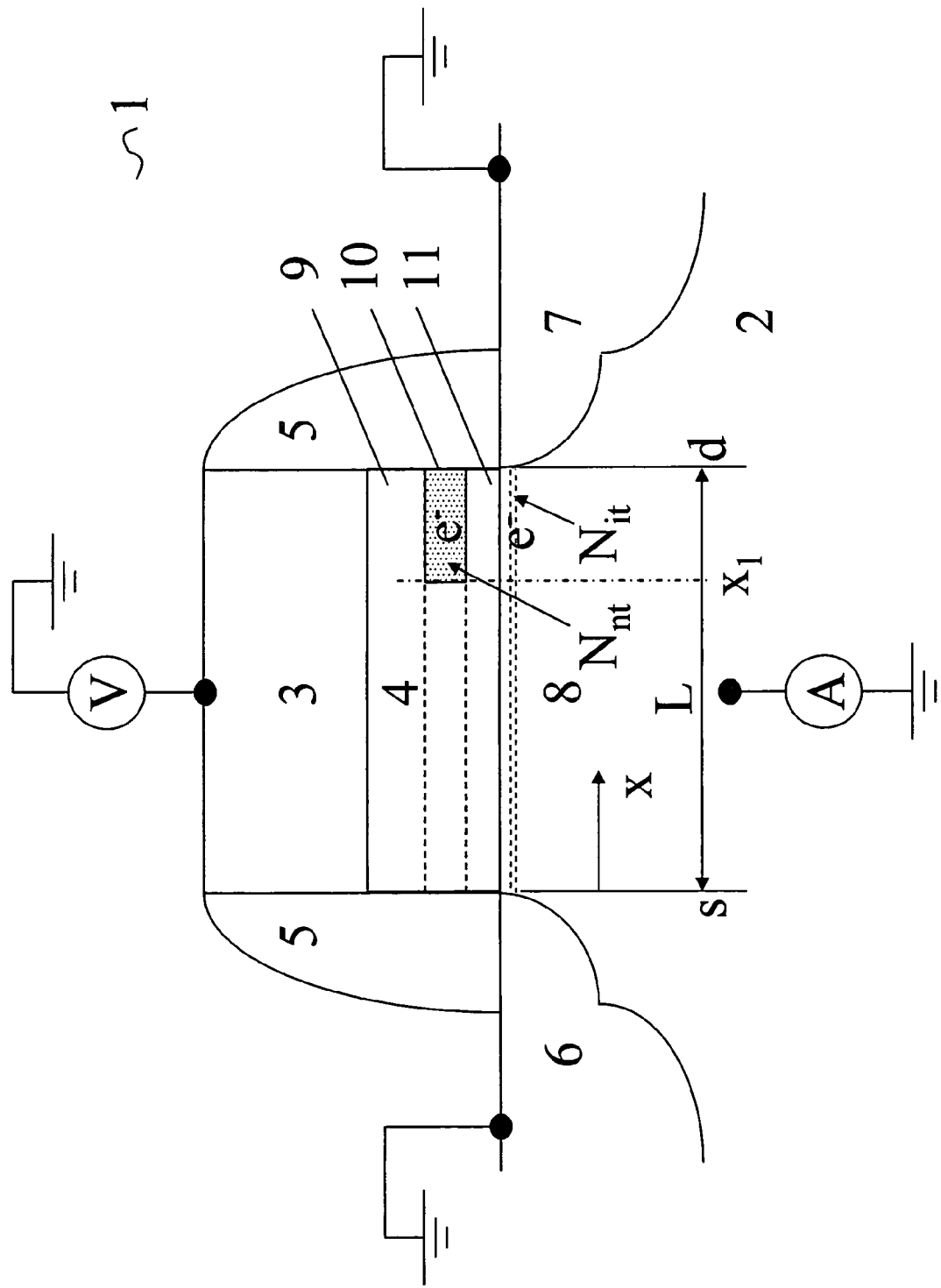
FIGS. 4a-c include a schematic cross section of a semiconductor device with accompanying graphs illustrating electrical properties of the device.
Figure 4B:
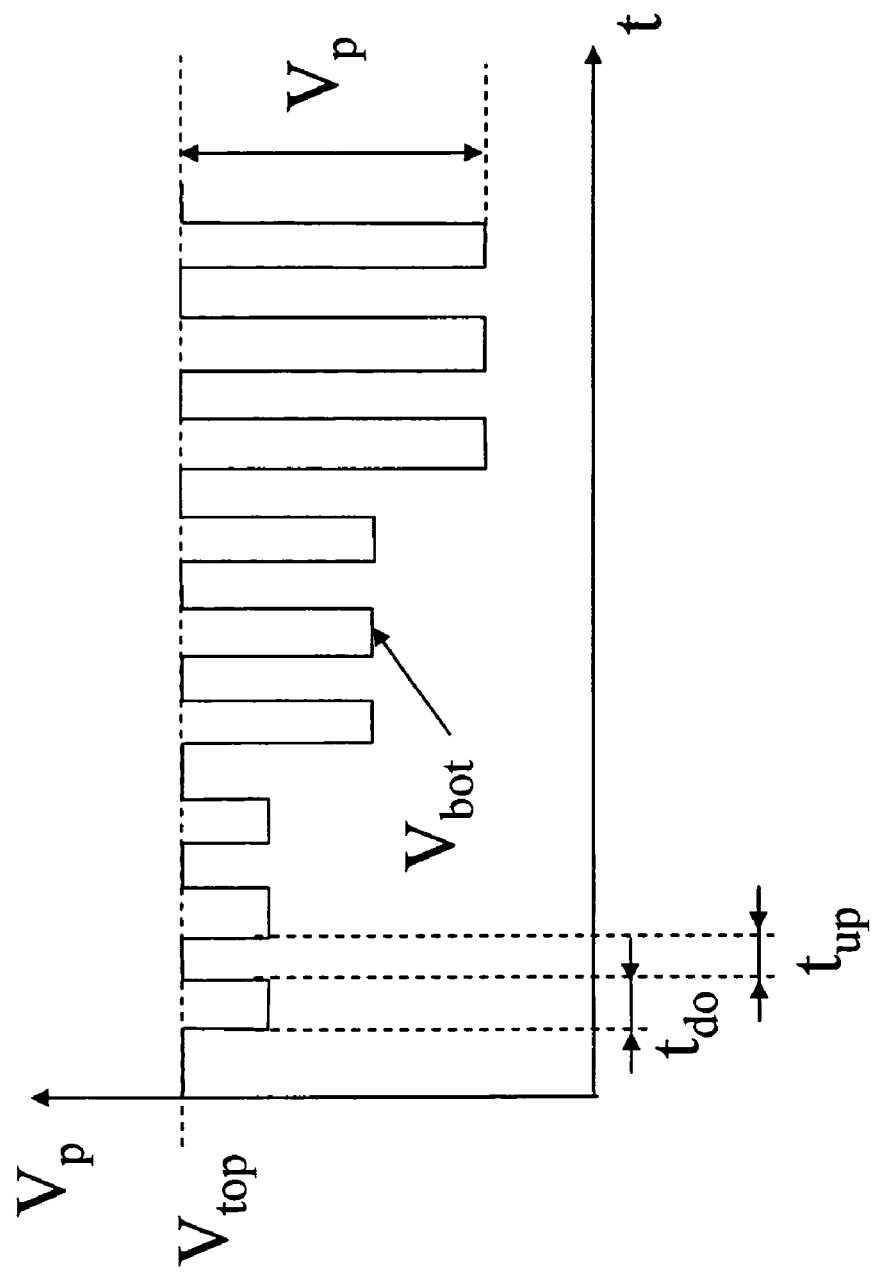
Figure 4C:
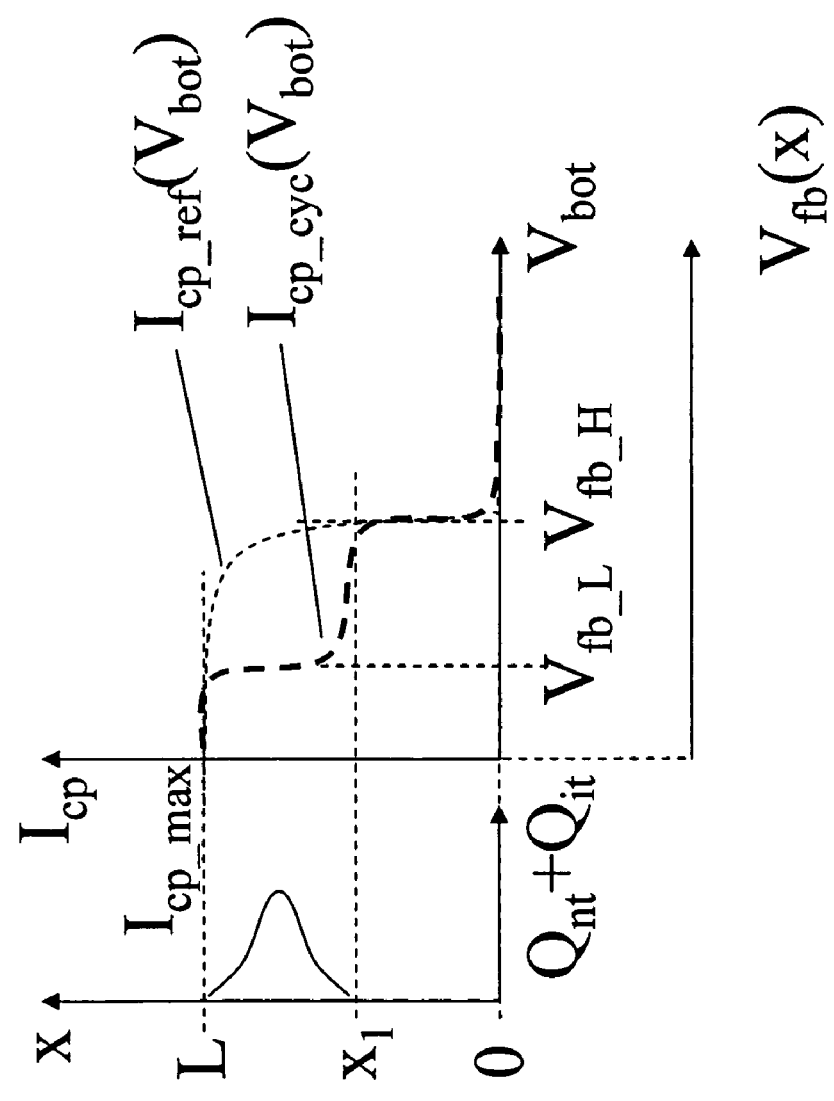

A second charge-pumping measurement is performed on this device under test. FIG. 4a illustrates such a device wherein a number $N_{nt}$ of negative charged particles (dotted area between position $x_1$ and drain d) is stored in the charge-trapping layer (10). A number of interface states Nit is present (dots in the channel). A pulse train, similar to the pulse train applied during the second measurement on the device in the reference state, is applied to the gate electrode (3), whereby each pulse in this pulse train has the same top-level $V_{top}$. The amplitude $V_p$ of the pulses increases monotonically with time by lowering the bottom-level $V_{bot}$ of the pulses. The exemplary pulse train shown in FIG. 4b comprises 9 pulses grouped in sets of 3. The pulses in the first set have the lowest amplitude or voltage swing, the pulses in the second set have a higher amplitude, while the pulses in the last set have the highest amplitude. The number of pulses in the pulse train, their duty cycle, the amplitude of each pulse, the way the amplitude $V_p$ is increased over the pulse train, e.g. stepwise, gradually, the upper level $V_{top}$ are parameters of choice and can be selected in view of the required accuracy and measurement resolution. This pulse train with fixed top-level $V_{top}$ and varying bottom-level $V_{bot}$ will fill the interface states with electrons during the uptime $t_{up}$ of the pulse and with holes during the downtime $t_{do}$ of the pulse in these locations where the pulse is swept over the corresponding flatband voltage. As long as the lower level $V_{bot}$ of the pulse is above the local flatband voltage $V_{fb\_L}$ the portion of the channel between $x_1$ and d will remain in inversion and the interface traps are always filled with electrons as shown in FIG. 4a by the symbol e⁻. This portion of the channel (8) having the lower flatband voltage $V_{fb\_L}$ will switch between inversion and accumulation depending on whether the lower level $V_{bot}$ of the progressively increased pulse amplitude is above or below this lower flatband voltage and the corresponding interface traps in this region will be alternatively filled with electrons and holes during the charge-pumping measurements. If the pulse sequence of FIG. 4b is applied to the device of FIG. 4a the channel is scanned from drain to source if the flatband voltage $V_{fb}(x)$ increases monotonically from the source to the drain. The same procedure as applied to the charge-pumping signal in the first step for extracting the flatband voltage $V_{fb}(x)$ profile from the charge-pumping current for the device under test is applied to this stressed device as illustrated by FIG. 4c. A relationship between the flatband voltage profile $V_{fb}(x)$ and the location x in the channel can be established by the fact that the increase of the charge-pump current $I_{cp}$ from one location $x_1$ in the channel to another location $x_2$ can be attributed to the number of interface traps $N_{it}$ present in the channel area between these location. This relationship is expressed as follows:

$$\int_{x_1}^{x_2} qfN_{it}(x)dx \approx I_{cp}(V_{fb}(x_2)) - I_{cp}(V_{fb}(x_1)) \qquad [3]$$

with q the absolute value of the electron charge, f the frequency of the pulse. In this figure the dotted line indicates the charge-pump curve of the reference device, while the heavy dotted line indicates the charge-pump curve obtained on the stressed device. The deviation between both charge-pump curves and hence in the corresponding flatband voltages is induced by the total charge ($Q_{nt}+Q_{it}$) present, for each point x along the channel, as expressed in the following formula:

$$\Delta V_{fb}(x) = \qquad [4]$$
$$V_{fb\_ref}(x) - V_{fb\_cyc}(x) = \frac{\Delta Q_{nt}(x) + \Delta Q_{it}(x)}{2C} = \frac{q\Delta N_{nt}(x) + q\Delta N_{it}(x)}{2C}$$

with C the capacitance of the dielectric stack (4) (F/cm²) and q the absolute value of the electron charge. The concentration of charge in the charge-storage layer $N_{nt}(x)$ (#/cm²) is positive if electrons are trapped, while the local concentration of interface traps $N_{it}(x)$ is also in (#/cm²). By varying the bottom level of the voltage pulses applied on the gate as described in this paragraph the charge-pumping curves of FIG. 4c are obtained. During this charge-pumping measurement the threshold voltage and flatband voltage at any given point is determined by the charge at that point: electrons stored in the charge-trapping layer (10) and the electrons trapped in the interface states.

Figure 5:
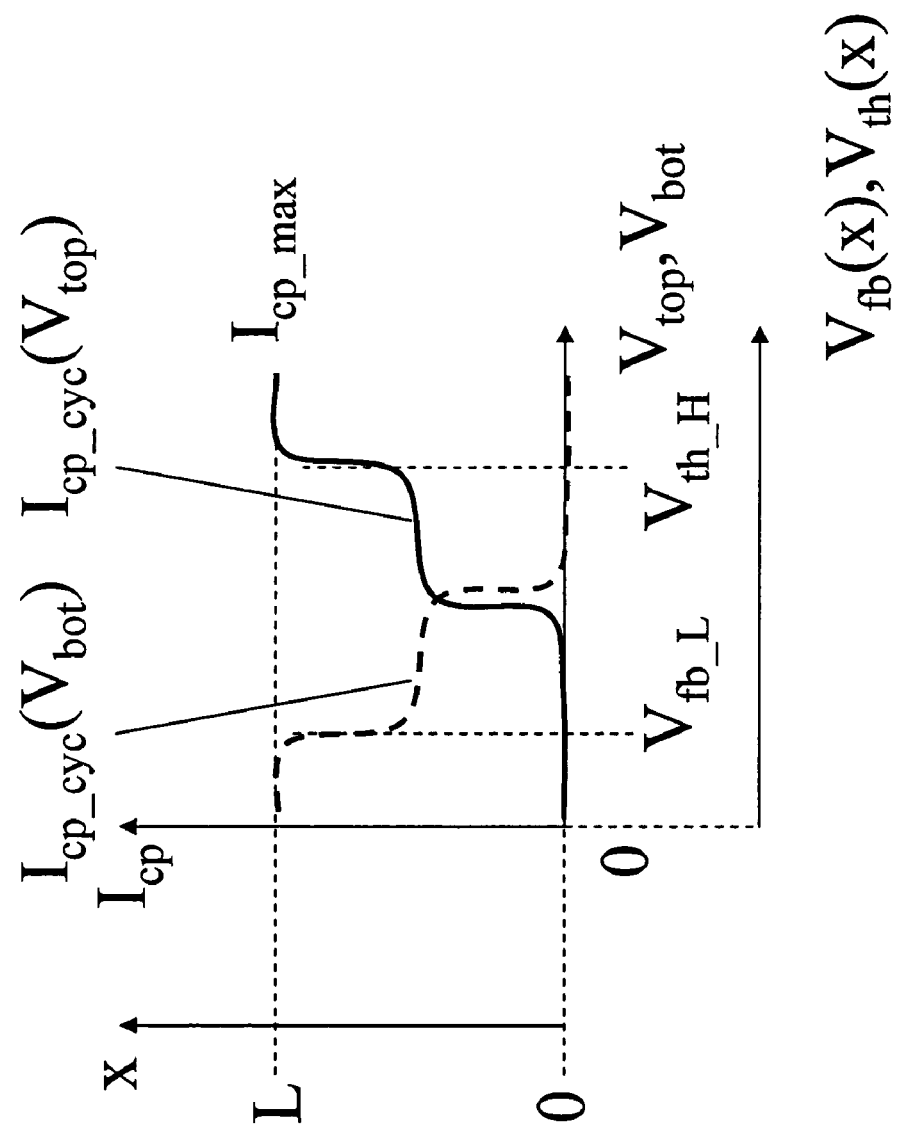
FIG. 5 is a schematic charge-pump curve.

The charge-pumping curves obtained on the stressed device are compared with the charge-pumping curve of the reference device or unstressed device. The deviation between the reference curves on the one hand and the corresponding stressed curves is due to the overall threshold or flatband voltage variation caused by the charge in the charge-trapping layer (10) and in the interface states. The difference between the two deviations is due to the charge in the interface states only. FIG. 5 combines the two charge-pump curves obtained on the stressed device. In both cases the maximum current measured $I_{cp\_max}$ is substantially the same, such that for any location x in the channel, the following relationship holds:

$I_{cp}(x)$ (varying top level)+$I_{cp}(x)$ (varying bottom level)=$I_{cp\_max}$     [5]

Figure 6:
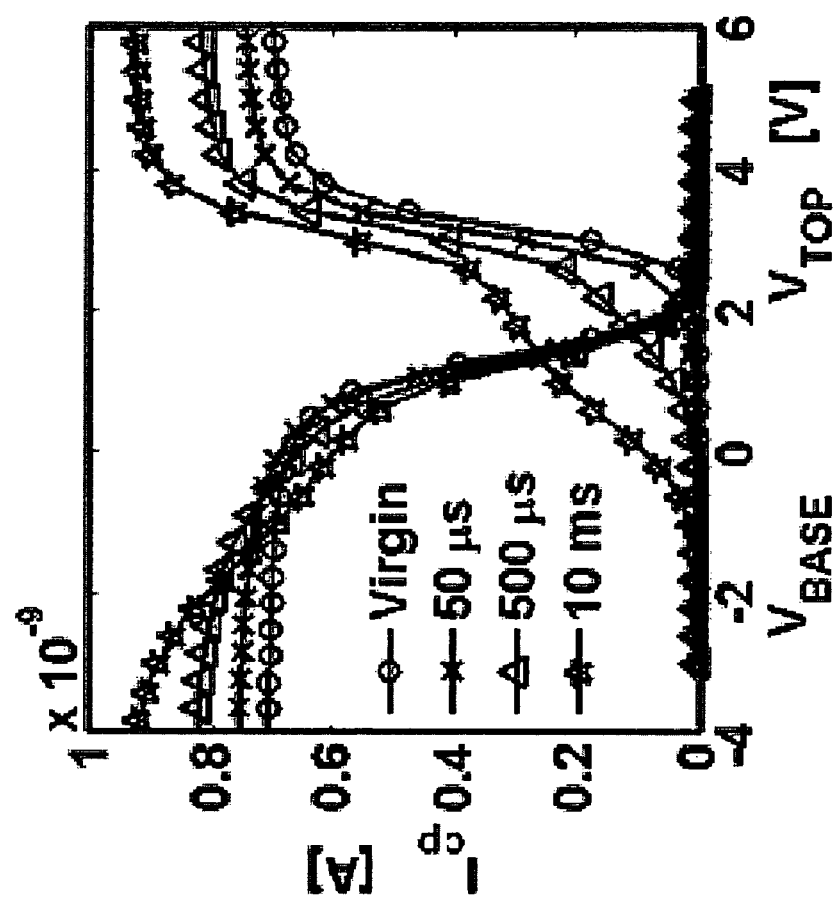
FIG. 6 shows charge-pumping curves for varying top-level or bottom-level.

The correlation between the two measurements on the stressed device depend on $I_{cp\_max}$, which makes the results of the extraction very sensitive to this value. Theoretically, the charge-pumping curves saturate completely if the top level of the pulse is high enough (or if the base level of the pulse is low enough, following the type of measurement). The measurements in FIG. 6 show that the saturation is in reality not perfect, curves slightly continue to increase for high voltages. This causes incertitude on $I_{cp\_max}$. The best choice of $I_{cp\_max}$ is explained later in this text.

Using the data from the charge-pumping measurements with respectively varying top and bottom level performed on the device in the reference state (FIG. 1c, 1e) and on the cycled device (FIG. 3c, 4c) and the above equations ([1], [2], [3], [4], [5]) one can determining the contribution of the charge in the charge-trapping layer (10) and of the charge in the interface states to the change in threshold voltage.

Equations [2] and [4] can combined to yield the following formula:

$$(V_{th\_ref}(x) - V_{fb\_ref}(x)) - (V_{th\_cyc}(x) - V_{fb\_cyc}(x)) = \frac{q\Delta N_{it}(x)}{C} \qquad [6]$$

Equation [1] can be written as:

$$\int_{x_{i-1}}^{x_i} qfN_{it}(x)dx \approx$$ [7]

$$((N_{it}(x_i) - N_{it}(x_{i-1}))\left(\frac{x_i - x_{i-1}}{2}\right) \approx I_{cp}(V_{th\_cyc}(x_i)) - I_{cp}(V_{th\_cyc}(x_{i-1}))$$

By solving successively equations [6] and [7] from a starting point $x_o$ to a final point $x_{end}$ one can find the position $x_i$ from equation [7] which corresponds to the interface states $N_{it}(x_i)$ from equation [6]. The profile of charge in the charge-trapping layer can be found by either solving equation [2] or [4].

The method allows an easy way to check the precision of the extracted profiles. Indeed, the last calculated position $x_{end}$ corresponds to the effective length of the channel:

$$x_{end} = L_{eff}$$ [8]

As explained before, the results are very sensitive to $I_{cp\_max}$. $I_{cp\_max}$ is then chosen such as equation [8] is verified. The use of $I^{cp}_{\_max}$ as a variable and the addition of the equation [8] allow a higher accuracy on the extracted profiles. This is made possible by the new direct method to solve the equations [5-7].

In the following paragraph the extraction procedure is discussed in more detail. If the difference $(V_{th\_ref}(x) - V_{fb\_ref}(x))$ in equation [6] is constant, because the number of interface traps $N_{it,ref}$ of the device in the reference state is constant and equal to the ratio $(I_{cp\_max}/L_{eff})$, this difference is given by combining the threshold voltage profile and flatband voltage profile given by respectively FIGS. 1c and 1e. For the device in the reference state, equation [5] allows to determine for a selected threshold voltage $V_{th\_cyc}$ the corresponding flatband voltage $V_{fb\_cyc}$, as the sum of the corresponding charge-pump currents are equal to the maximum charge-pump current $I_{cp\_max}$. The starting point $x_o$ is selected such that the threshold voltage $V_{th\_cyc}(x_o)$ is not shifted and the number of interface states $N_{it}(x_o)$ is equal to the number of interface states in the device in the reference state $N_{it,ref} = (I_{cp\_max}/L_{eff})$. By directly solving equations [6] and [7] successively for all measurement points in the charge-pump curve from this starting point $x_i = x_o$ to $x_i = x_{end}$, one can find the position $x_i$ from equation [7] which corresponds to the interface states $N_{it}(x_i)$ from equation [6]. The profile of charge in the charge-trapping layer can be found by either solving equation [2] or [4].

If the difference $(V_{th\_ref}(x) - V_{fb\_ref}(x))$ in equation [6] is not constant, equations [6] and [7] cannot be solved directly. Both equations are then rewritten in the form "$N_{it}(x_i) = $" which can be solved numerically.

$$N_{it}(x_i) = N_{it,ref} + \frac{C}{q}[(V_{th\_ref}(x) - V_{fb\_ref}(x)) - (V_{th\_cyc}(x) - V_{fb\_cyc}(x))]$$ [9]

$$N_{it}(x_i) = \frac{2[I_{cp}(V_{th\_cyc}(x_i)) - I_{cp}(V_{th\_cyc}(x_{i-1}))]}{x_i - x_{i-1}} - N_{it}(x_{i-1})$$

Hence this extraction technique allows determining the contribution of the charge in the charge-trapping layer (10) and of the charge in the interface states to the change in threshold voltage.

In FIG. 5 the two charge-pumping curves used in the extraction method of the previous embodiments are shown. Ideally the charge-pumping current $I_{cp}$ reaches a maximum charge-pumping current $I_{cp\_max}$ corresponding to a voltage bias $V_{top}$ or $V_{bot}$ wherein the complete area of the channel (8) having a known channel length $L_{eff}$ contributes to the charge-pumping current. For this well-defined maximum charge-pumping current $I_{cp\_max}$ one can reconstruct the spatial distribution of charge $N_{nt}$ stored in the charge-trapping layer (10) of a semiconductor device (1). However in real measurements the current measured when applying a varying base-level or top-level voltage pulse sequence might not reach a maximum value and will continue to vary with varying pulse voltage. When such charge-pumping curves are obtained one can determine the maximum charge-pumping current $I_{cp\_max}$, corresponding to the complete area of the channel (8) having a known channel length $L_{eff}$, from the effective charge-pumping curves in various ways some of which are described in the embodiments below.

In a preferred embodiment of the extraction method, the charge pumping curves are combined as follows. As described before, a relation between the charge pumping current $I_{cp}$ and the calculated channel length $L_{calc}$ of the semiconductor device is established. In this embodiment, this is done by selecting on one of the charge pumping curves at least two charge pumping currents $I_{cp}$ and determining the calculated channel length $L_{calc}$ corresponding to each of the charge pumping currents $I_{cp}$ by reconstructing the spatial charge distribution for each of the charge pumping currents $I_{cp}$. In this way, a set of at least two datapoints $(L_{calc}, I_{cp})$ is obtained. From this set of datapoints, the charge pumping current $I_{cp}$ having a channel length substantially equal to the effective length $L_{eff}$ i.e. the maximum charge pumping current $I_{cp\_max}$ can be obtained as follows.

For example, various existing numerical techniques can be used to determine from this set of at least two datapoints $(L_{calc}, I_{cp})$, the datapoint $(L_{calc} = L_{eff}, Icp = I_{cp\_max})$. Once can use known numerical analytical techniques such as linear interpolation or binary search to determine this datapoint $(L_{eff}, I_{cp\_max})$. A person skilled in the art will appreciate that the first values of the charge pump current $I_{cp}$ are selected from the upper current range of the measured charge-pumping curve as such selection will speed up the extraction process.

As an alternative, an analytical function $L_{calc}(I_{cp}) - L_{eff} = 0$ can be determined from the set of at least two datapoints $(L_{calc}, I_{cp})$, and by solving this analytical function the charge pumping current $I_{cp}$ having a channel length substantially equal to the effective length $L_{eff}$, i.e. the maximum charge pumping current $I_{cp\_max}$, can be determined. Then, the spatial distribution $N_{nt}$ of the charge is extracted by reconstructing the spatial charge distribution from the charge pumping curves using the value of $I_{cp} = I_{cp\_max}$. A person skilled in the art will appreciate that the first values of the charge pump current $I_{cp}$ are selected from the upper current range of the measured charge-pumping curve as such selection will speed up the extraction process.

Another alternative could be to combine the data from the charge pumping curves as follows. Again a relation between the charge pumping current $I_{cp}$ and a calculated channel length $L_{calc}$ of the semiconductor device is established by selecting on one of the charge pumping curves a value of the charge pumping current $I_{cp}$ and determining the calculated channel length $L_{calc}$ corresponding to this charge pumping current $I_{cp}$ by reconstructing the spatial charge distribution for this charge pumping current $I_{cp}$. In this embodiment however, the calculated channel length $L_{calc}$ is compared with the effective length $L_{eff}$ and in case of a mismatch, a new value for the charge pumping current $I_{cp}$ is determined using the information given by the mismatch, i.e. the selection of the value for the charge pumping current $I_{cp}$ is optimised. This sequence of steps is repeated until the mismatch between the calculated channel length $L_{calc}$ and the effective length $L_{eff}$ is substantially zero, in which case the determined charge pumping current $I_{cp}$ corresponds to the maximum charge pumping current $I_{cp\_max}$. The spatial distribution $N_{nt}$ of the charge is then extracted by reconstructing the spatial charge distribution from the charge pumping curves using this value of $I_{cp}=I_{cp\_max}$. A person skilled in the art will appreciate that the first values of the charge pump current $I_{cp}$ are selected from the upper current range of the measured charge-pumping curve as such selection will speed up the extraction process.

In the above extraction methods the determined charge pumping current $I_{cp}$ is said to correspond to the maximum charge pumping current $I_{cp\_max}$, when the difference between the obtained calculated channel length $L_{calc}$ and the effective length $L_{eff}$ is less than 2%, preferably less than 1% of the effective channel length $L_{eff}$.

Although the extraction methods according to the present application are particular useful for extracting the spatial distribution of charge $N_{nt}$ stored in the charge-trapping layer (10) of a memory device (1), these extraction methods can be applied to any kind of semiconductor device (1) wherein a dielectric stack (4) is sandwiched between an electrode (3) and a semiconductor region (2). The disclosed extraction methods can be used to the extract charge stored in this dielectric stack (4). For example in a MOSFET, used as logic transistor, charge might be unintentionally incorporated in the gate dielectric (4). Typically this incorporated charge might result from the device operation, e.g. hot carriers, or result from the semiconductor manufacturing process introducing fixed or mobile charge in the gate dielectric. This gate dielectric can be of a single dielectric material such as silicon-oxide, silicon-oxy-nitride, a high-k dielectric such as alumina-oxide, hafnium-oxide, or hafnium-silicon-oxide as known in the art. Likewise this gate dielectric can be a stack of dielectric materials, e.g. a high-k dielectric formed upon a silicon-oxide. As is the case for the memory device in the previous embodiments, this charge $N_{nt}$ will also influence the threshold voltage profile $V_{th}(x)$ and flatband voltage profile $V_{fb}(x)$ of the logic transistor. Hence the disclosed extraction methods can also be applied to such logic transistor to determine the spatial distribution of the incorporated charge $N_{nt}$.

In the disclosed extraction methods the spatial charge distribution $N_{nt}$ is reconstructed from the charge pumping curves by combining data from these charge pumping curves to obtain the spatial distribution. This data from the charge pumping curves can be further combined to obtain a spatial distribution of charge ($N_{it}$) in traps present at the interface between the channel (8) and a dielectric stack (4). Hence the present extraction methods also allow determining the spatial distribution of this interface charge $N_{it}$, even when charge is present in the dielectric stack (4). The dependency of this interface charge on parameters of the semiconductor process or of device operation can thus more accurately be determined.

Figure 7:
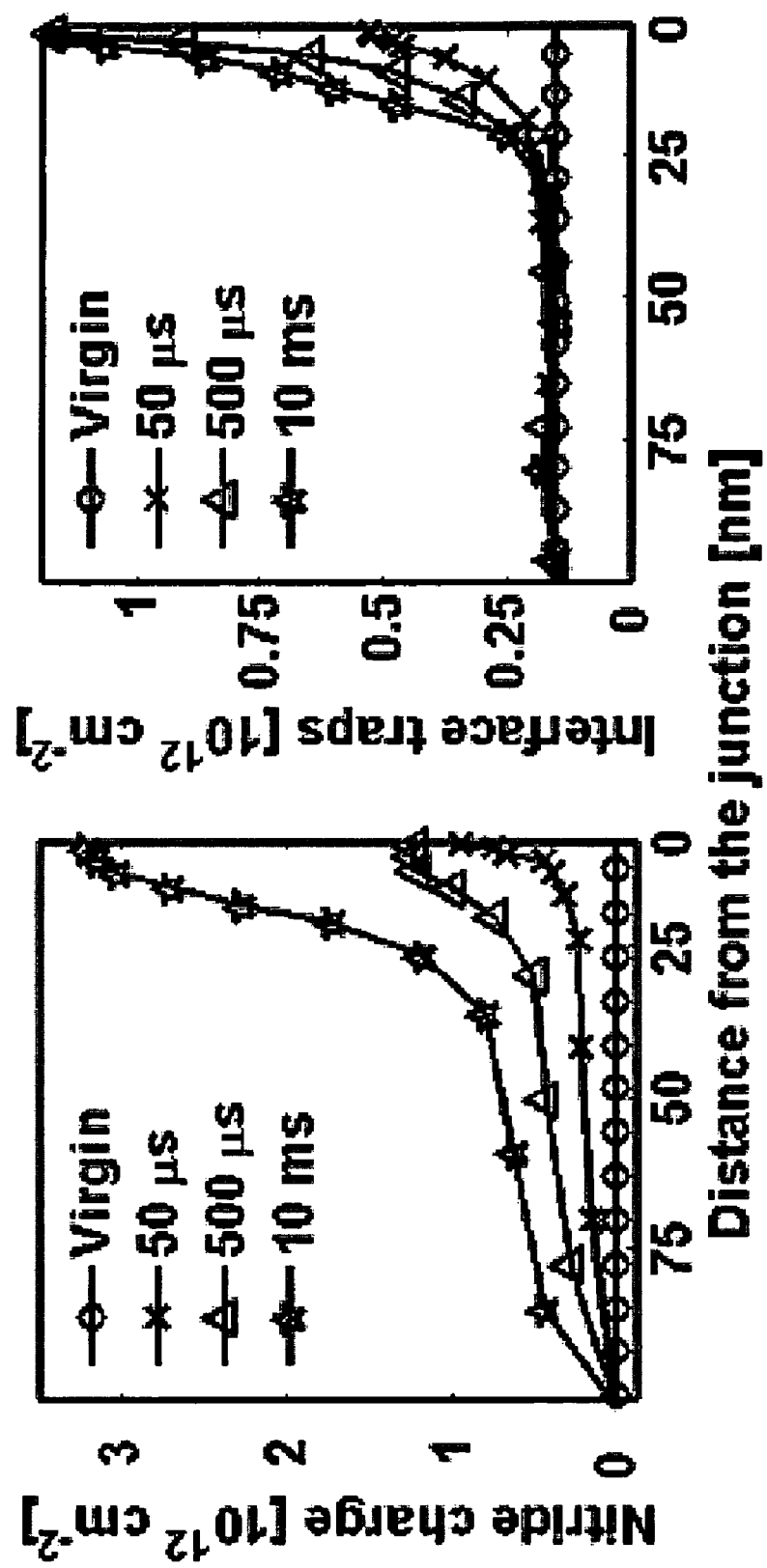
FIG. 7 shows the distribution profile of the charge in charge-trapping layer and in the interface traps.
Figure 8:
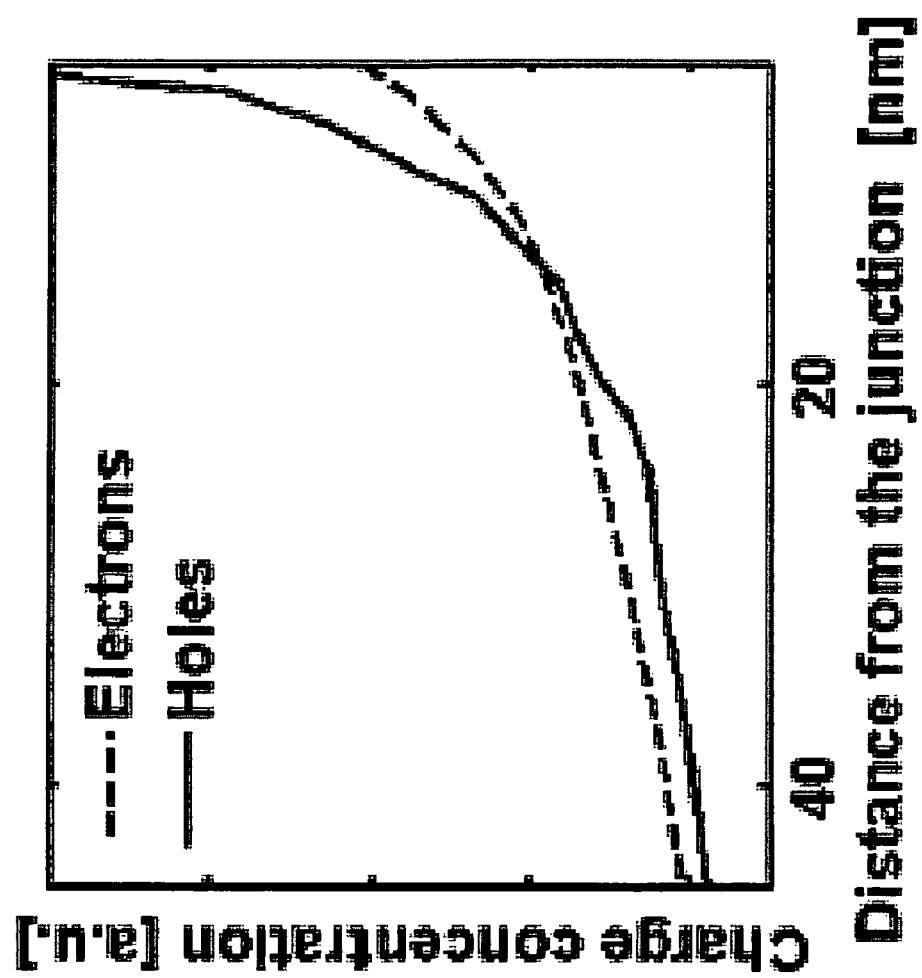
FIG. 8 shows the distribution profile of charge in the trapping-layer for respectively electrons and holes following a program and erase operation according to an embodiment of a first aspect of the invention.

FIGS. 6 to 8 illustrate one preferred embodiment of the invention.

FIG. 6 shows two sets of charge-pumping curves obtained using respectively the varying top-level and varying-base level pulse sequence described above. The rising curves are obtained using the fixed-bottom/varying top-level pulse sequence. The falling curves are obtained using the fixed-bottom/varying base-level pulse sequence. Each set contains a curve for a reference device, i.e. an unstressed nMOS device with an ONO layer as gate dielectric, and curves for the same nMOS devices (1) that were subjected to respectively 50 us, 500 us and 10 ms of hole injection. Nitride was used as charge-trapping layer. Holes where injected using typical state-of-the art voltage settings: grounding of source and bulk applying −5V to the gate and 5V to the drain. The longer the injection time the more positive charge is stored in the device and the larger the shift in the charge-pumping curve compared to the virgin device.

From these curves the distribution of the charge in the nitride layer ($N_{nt}$) and in the interface traps ($N_{it}$) for the respective devices can be extracted with the extraction techniques described herein. FIG. 7 shows the corresponding distribution curves. With progressive injection of holes the interface becomes more degraded.

Using the above described charge-pumping technique allows extracting the distribution profile of the charge in the nitride layer whether electrons or holes are trapped in this nitride layer while, taking the degradation of the interface states into account. FIG. 8 shows the distribution profile of the charge in the nitride layer of an nMOS memory cell after a programming operation when electrons are trapped and of the charge in the nitride layer of an nMOS memory cell after an erase operation when holes are trapped. Programming of an nMOS memory cell was done by using typical state-of-the-art voltage settings: grounding of source and substrate, applying 9V to the gate and 3.5V to the drain. Erasing of an nMOS memory cell was done by using typical state-of-the-art voltage settings: grounding of source and substrate, applying −5V to the gate and 5V to the drain.

A method for operating a charge-trapping memory device is disclosed, resulting in improved endurance and/or retention characteristics of this memory device.

Figure 9A:
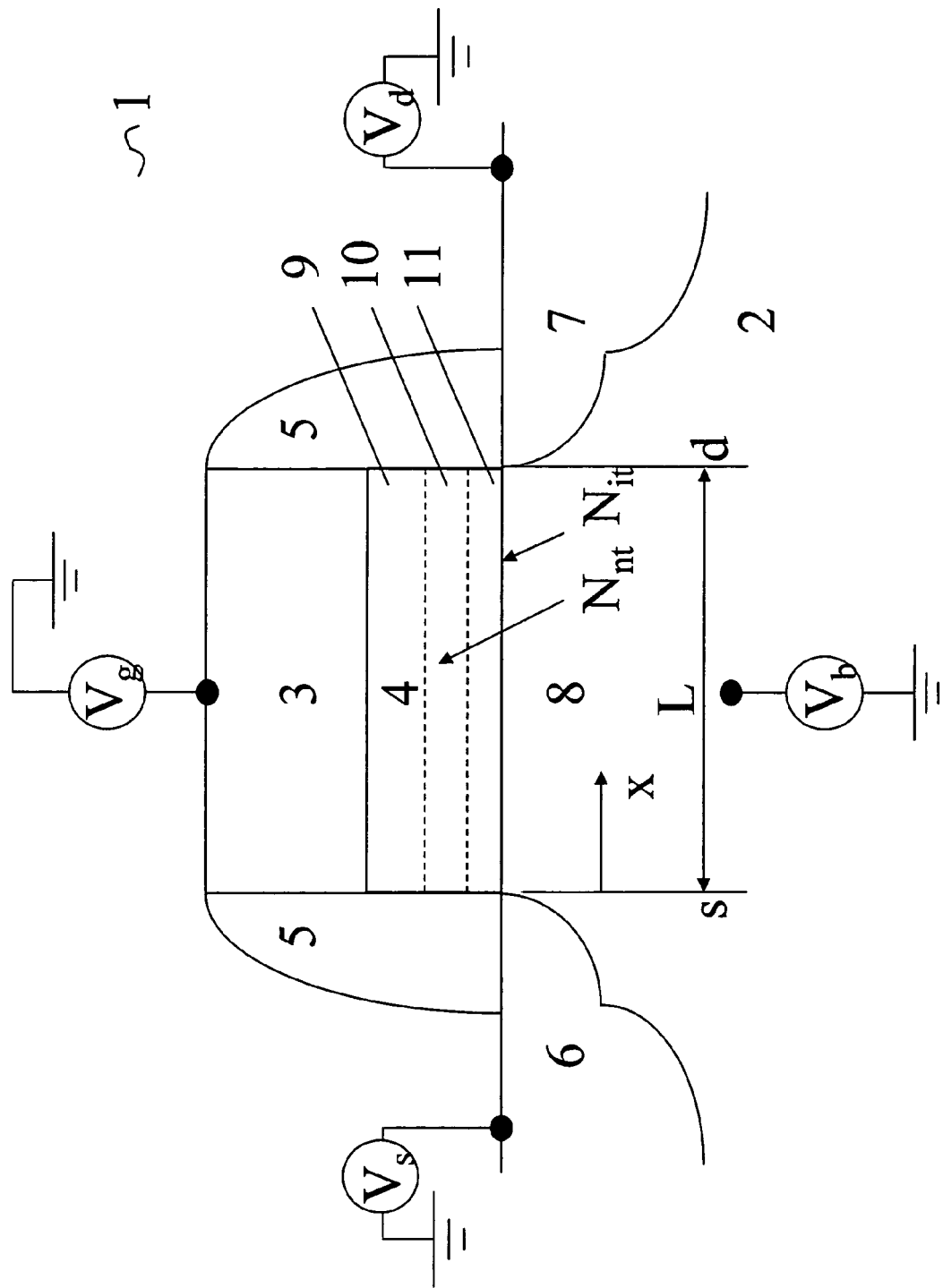
FIG. 9a-b shows a) a schematic cross-section of a NROM™-type memory device and b) the link to a memory matrix.

FIG. 9a shows a schematic cross-section of such a memory device. This device (1) comprises a gate electrode (3) separated from the substrate (2) by a gate dielectric (4). Typically the gate electrode is formed from a semiconductor material such as polycrystalline silicon doped to obtain the desired workfunction and/or conductivity. This semiconductor material can be partially or fully silicided as known in the art or even metals, e.g. Al, TiN, TaN, are used. The gate dielectric (8) comprises a dielectric charge-trapping layer (10) such as silicon-nitride, silicon-rich oxide, silicon-oxynitride, an oxide layer comprising nanocrystals of a semiconductor material, e.g. polycrystalline silicon. Optionally this charge-trapping layer can be separated from the substrate (2) by another dielectric layer (11) with low or no trapping capabilities, e.g. silicon-oxide. Another layer (9) in a similar material as layer (11) can be used to separate the charge-trapping layer (10) from the gate electrode (3). The substrate (2) is a semiconductor substrate, e.g. silicon, silicon-on-insulator (SOI), germanium-on-insulator (GOI). Adjacent to the stack of gate electrode (3) and gate dielectric (4) sidewall spacers (5) formed in a dielectric material such as silicon-oxide, silicon-oxynitride, silicon-carbide, can be present. Aligned to this stack source (6) and drain regions (7) are formed in the substrate (2). The source (6) and drain regions (7) are of an opposite conductivity type as the substrate (2). The source (6) and drain regions (7) extend under the spacers (5) such that the channel region (8) is contacted. This channel region (8) is under dielectric control of the gate electrode (3). The device of FIG. 9a can be manufactured using processing steps and materials known to any person skilled in the art of manufacturing semiconductor devices, in particular non-volatile memory devices.

For the purpose of the present description, it is assumed that the device (1) is an NROM™ (Nitride Read Only Memory)-memory device: a nMOSFET comprising a polysilicon gate electrode (3), which is n-type doped. Also source (6) and drain (7) regions are n-type doped while the substrate (2) is p-type doped. Sidewall spacers (5) formed in silicon-oxide are present. The gate dielectric (4) consists of a nitride layer used as charge-trapping layer (10) sandwiched between two layers (9, 11) of silicon-oxide. However the invention is not limited to this example. It will be appreciated that there are numerous variations and modifications possible. Accordingly, the description should not be deemed to be limiting in scope. A person skilled in the art will realize that the present invention is not limited to n-type charge-trapping memory devices wherein the memory device is formed on a p-doped substrate (2) with electrons as minority carriers and wherein source (6) and drain (7) regions are n-doped. The embodiments disclosed in this application can also be applied to p-type charge-trapping memory devices as well wherein the memory device is formed on an n-doped substrate (2) with holes as minority carriers and wherein source (6) and drain (7) regions are p-doped.

Likewise a person skilled in the art will realize that programming and erasing a memory device comprises injection of negative and positive charged carriers. It is a matter of convention to state that a n-type memory device is programmed by injecting electrons and erased by injecting holes and that a p-type memory device can be programmed by injecting holes and erased by injecting electrons. Therefore in the description the words first and second carrier type will be used to distinguish between carriers used for programming and opposite charged carriers used for erasing the memory device.

Figure 9B:
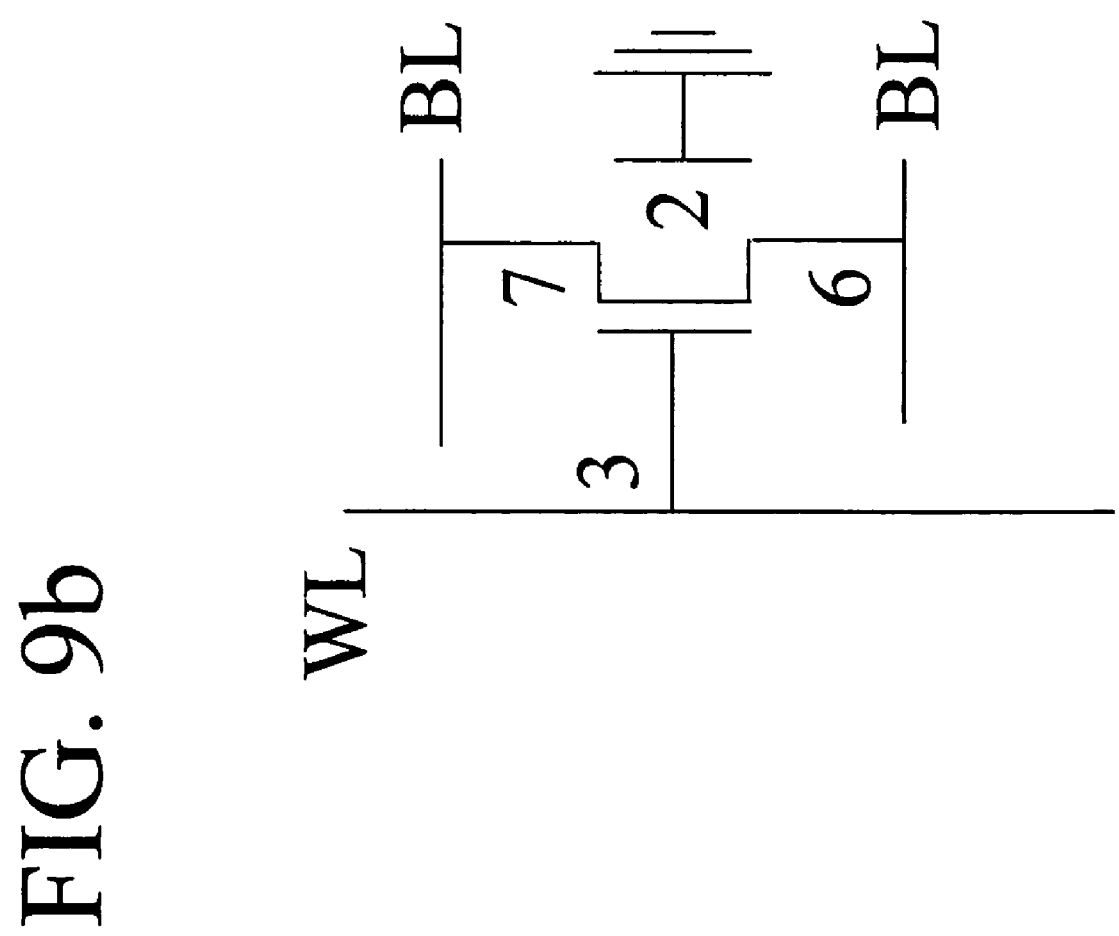

As shown in FIG. 9a the source (6), drain (7), gate electrode (3) and the bulk (2) can be individually biased to respective source voltage $V_s$, drain voltage $V_d$, gate voltage $V_g$ and bulk voltage $V_b$. An electrical schematic of the device of FIG. 9a is given in FIG. 9b illustrating the fact that the memory device is part of a matrix of similar memory device constituting a memory. The voltages to the different electrodes of the memory device are supplied via the wiring of such memory matrix. Typically the source (6) and the drain (7) electrodes are connected to their respective bitlines (BL), while the gate electrode (3) is connected to a wordline (WL). Typically the substrate (2) is connected to a common ground.

Figure 10:
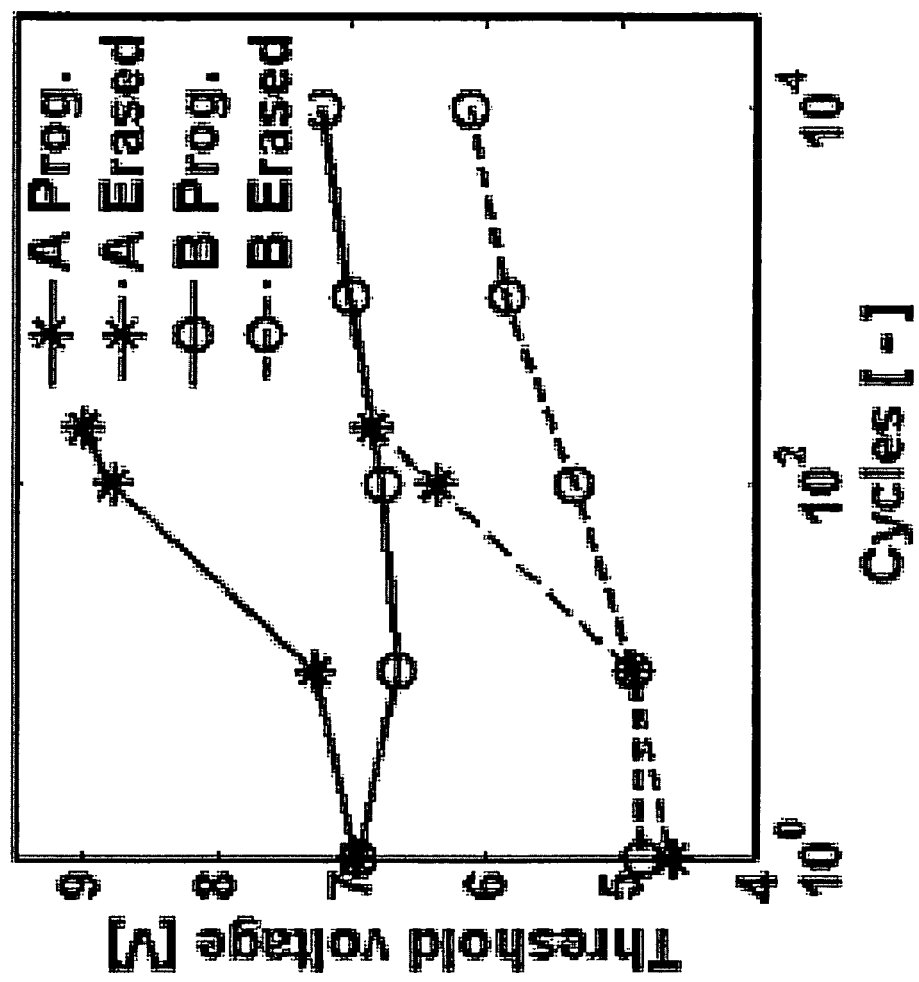
FIG. 10 shows a comparison of the cycling characteristics without verify for conventional NROM™ operation conditions (A) and for operation conditions according to an exemplary embodiment of the invention (B)

During cycling of the memory device, i.e. repetitive programming and erasing of a memory cell, one wants to compensate the negative charge in the charge-trapping layer, e.g. introduced when programming the memory device, by a positive charge, e.g. introduced when erasing the memory device. If not, opposite charged carriers would only partially compensate each other. When cycling the memory device, the non-compensated charge will gradually add up and deteriorate the operation window of the memory device as its threshold voltage profile $V_{th}(x)$ shifts. The endurance of the NROM™-type memory devices, when operated using state-of-art voltage settings even if a verify scheme is used to correct for the shift in threshold voltage, is known to be limited to about 10,000 cycles due this shift in threshold voltage which already occurs after 100 cycles. The lifetime of the memory device can be extended by a separate adjustment of the threshold voltage during a so-called verify scheme in which the shift in threshold voltage is determined and, when appropriate, additional charge is injected into the charge-trapping layer. This is illustrated in FIG. 10 showing the change in threshold voltage during cycling of a memory device using typical prior art voltage settings (A: star) for programming (solid line), e.g. $V_s=V_b=0V$, $V_d=3.5V$, $V_g=9V$ during 0.25 ms, and for erasing (dotted line) e.g. $V_s=V_b=0V$, $V_d=5V$, $V_g=-5V$ during 1 ms. Even after a limited number of cycles the threshold voltage increases requiring higher voltages to be applied for operating the memory device. Also the retention of the NROM™-type memory device, when operated using state-of-art voltage settings, is limited.

The extraction method described above enables one to extract the distribution of the electrons and holes injected into the charge-trapping layer (10) of the memory device and hence to determine the voltage settings required to obtain the selected charge distribution. By applying this extraction method one can extract not only the distribution of the electrons after a programming operation but also the distribution of holes after an erasing operation. This extraction is more accurate as the degradation of the interface states is taken into account. The result of this extraction for a memory device is shown in FIG. 8. From this curve one can conclude that electrons injected into the charge-trapping layer (10) shows a larger spatial distribution than the holes injected into this layer. Due to this sharp hole profile, erasing of electrons trapped at a distance from the junction results in an excess of holes injected near the junction when prior art voltage settings are used. In its turn, these excess holes will shift the point at which electrons are injected during programming further away from the junction. Hence this difference in spatial distribution of electrons and holes should be taken into account when more complete charge compensation is to be obtained. Due to the non-conductive properties of the charge-trapping layer (10) charge injected in to such layer will to a large extent be fixed to its as-injected position. Therefore the voltages applied to the electrodes of the memory device should be selected such that the profiles of electron and holes do substantially match. This is illustrated by FIG. 11a showing the spatial distribution of electrons and FIG. 11b showing the spatial distribution of holes introduced in the nitride charge-trapping layer of an NROM™-type memory device for different program and erase settings which are listed in tables 1a and 1b below. These spatial distributions are extracted using the extraction technique described herein. Varying the voltage used during programming and/or erasing can thus modulate the charge distribution.

TABLE 1a voltage settings for programming an n-type NROM ™ memory device resulting in charge distribution curves of FIG. 11a

| Curve | source bias $V_s$ (V) | drain bias $V_d$ (V) | gate bias $V_g$ (V) | bulk bias $V_b$ (V) |
|---|---|---|---|---|
| 1 | 0 | 3.5 | 11 | 0 |
| 2 | 0 | 3.5 | 7 | 0 |
| 3 | 0 | 5 | 9 | 0 |
| 4 | −2 | 1.5 | 9 | 0 |
| 5 | −2 | 1.5 | 7 | 0 |

TABLE 1b voltage settings for erasing an n-type NROM ™ memory device resulting in charge distribution curves of FIG. 11b

| Curve | source bias $V_s$ (V) | drain bias $V_d$ (V) | gate bias $V_g$ (V) | bulk bias $V_b$ (V) |
|---|---|---|---|---|
| 1 | 2 | 5 | −2 | 0 |
| 2 | 3 | 8 | −2 | 0 |
| 3 | 0 | 6 | −5 | 0 |
| 4 | 0 | 4 | −5 | 0 |
| 5 | 0 | 6 | −2 | 0 |

Selecting the program and erase conditions will have a large impact on endurance and retention characteristics of the cycled memory device. In order to better match the electron and hole spatial distribution, the electron profile can be made sharper and the hole profile should be made wider.

The method for operating the non-volatile memory device (1) of FIG. 9a thus comprises the following steps. The device (1) is programmed by applying predetermined programming conditions, such that carriers of a first charge type, e.g. electrons, are injected into the charge-trapping layer (10), resulting in a first net charge distribution variation profile. The non-volatile memory device is erased by applying predetermined erase conditions, such that carriers of a second charge type, e.g. holes, are injected into the charge-trapping layer (10), resulting in a second net charge distribution variation profile. The predetermined programming and erase conditions are chosen such that the first net charge distribution variation profile is substantially the opposite of the second net charge distribution variation profile. If this condition would not be met, a build-up of charge within the charge-trapping layer (10) can occur and hence retention and endurance characteristics of the memory device can be deteriorated.

This deviation is due to the injection of first charge type carriers generated by secondary impact ionisation during programming. If electrons are used for programming an n-type charge-trapping memory device, electron-hole pairs will be created near the drain (7)—substrate (2) junction, where a high electrical field is present. This mechanism is known in the art as first impact ionisation. This first impact electron-hole pair will be split in accordance with the electrical field present near the drain (7)—substrate (2) junction. For an n-type memory device during typical programming conditions, primary impact electrons will drift towards the drain (7) while primary impact holes will drift into the substrate (2). In turn these primary impact holes will cause other electron-hole pairs to be generated in the substrate (2) of the memory device offset from the drain (7). This mechanism is known in the art as secondary impact ionisation. This second impact electron-hole pair will be split in accordance with the electrical field present in the substrate (2) region. For an n-type memory device during typical programming conditions, secondary impact electrons will drift towards the gate (3) while secondary impact holes will also drift into the substrate (2). As a result, one way of ensuring that the net variation profiles are substantially each others opposite, for an n-type device where the first type carriers are electrons, is to choose the predetermined programming conditions such that secondary electron injection.

As an alternative, for non-volatile memory devices wherein the first type carriers are holes, the predetermined programming conditions can also be chosen such that secondary hole injection is suppressed.

Preferably the difference in voltage applied to the drain (7) and the substrate (2) respectively, is chosen such that an electrical field distribution is created near the drain (7)—substrate (2) junction which prevents impact ionization. Preferably the difference in voltage applied to source (6) and drain (7) respectively, is chosen such that an electrical field is present sufficient for creating a drift current to flow from the source to the drain. For a low drain bias this means that, in absolute value, the source bias should be sufficiently lower than the drain bias and that the source (7)—substrate (2) junction becomes forward biased during programming.

From the curves 1 to 5 shown in FIG. 11a the conditions of curve 4 and 5 result in a sharper electron profile: the source is here biased negatively, while the gate can be biased more positively in order to reduce the programming time. From the curves 1 to 5 shown in FIG. 11b the conditions of curve 1 and 2 result in a wider hole profile: the source is here biased positively, while the gate can be made more negatively in order to reduce the erase time.

The above shows that program and erase voltages can be selected such that endurance and retention of the memory device can be improved. This is illustrated in FIG. 10 showing the limited change in threshold voltage during cycling of a memory device using voltage settings as described herein (B: circle) for programming (solid line), e.g. $V_s=-2V$, $V_b=0V$, $V_d=1.5V$, $V_g=9V$ during 15 ms, and for erasing (dotted line) e.g. $V_s=2V$, $V_b=0V$, $V_d=5V$, $V_g=-5V$ during 0.015 ms. Even after a large number of cycles the increase in threshold voltage can be substantially less than for the prior art voltage settings. As a better match of the electron and hole profiles is obtained using the voltage settings described herein, the erase time can be substantially reduced, as there is less need for supplying holes in excess of the number of electrons.

Figure 12A:
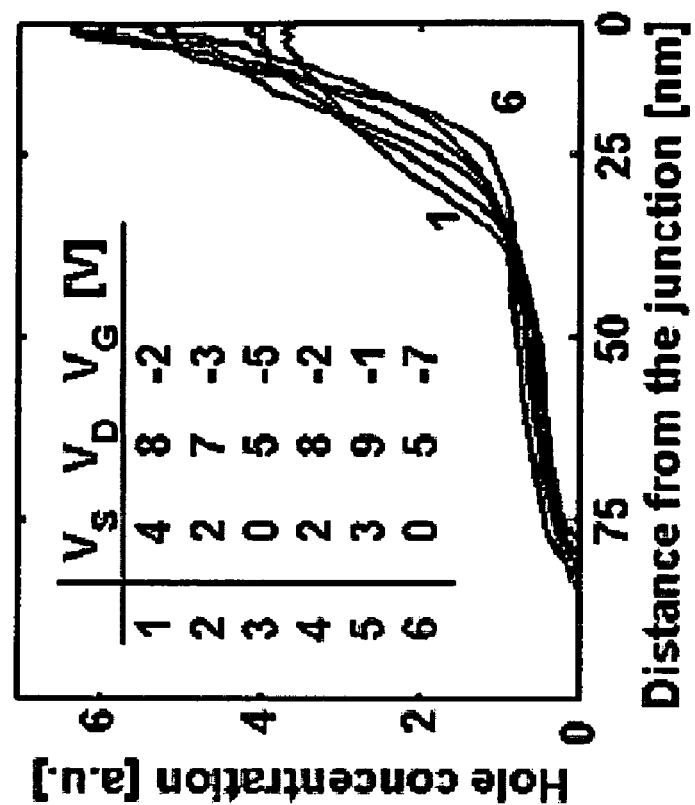
FIGS. 12a-b shows a) electron profiles and b) hole profiles extracted for different program and erase conditions.
Figure 12B:
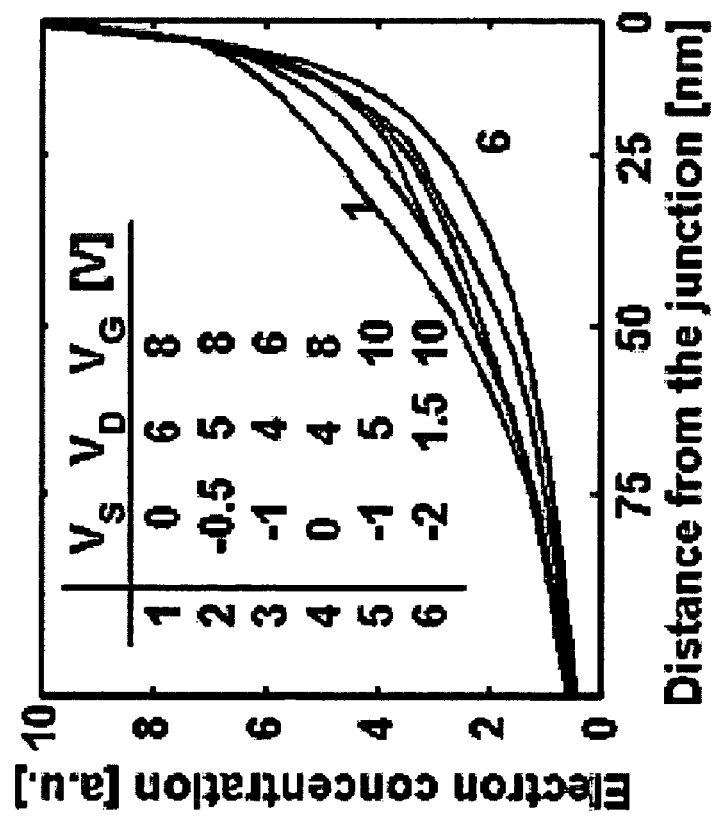

FIGS. 12a-b illustrate further embodiments. 0.11 um wide and 0.24 um NROM™-type memory devices with nitride as charge-trapping layer were manufactured using hot-carrier-injection optimized junctions. The oxide(11)/nitride(10)/oxide(9) layers of the gate dielectric stack (4) have the respective thickness of 8 nm/10 nm/7 nm.

Spatial distributions of electrons (shown in FIG. 12a) and holes (shown in FIG. 12b) introduced in the nitride charge-trapping layer of this NROM™-type memory device are determined for different program and erase settings which are listed in tables 2a and 2b below. The different curves are normalized to allow comparison. These spatial distributions are extracted using the extraction technique described herein.

TABLE 2a voltage settings for programming an n-type NROM ™ memory device resulting in charge distribution curves of FIG. 12A

| Curve | source bias $V_s$ (V) | drain bias $V_d$ (V) | gate bias $V_g$ (V) | bulk bias $V_b$ (V) |
|---|---|---|---|---|
| 1 | 0 | 6 | 8 | 0 |
| 2 | −0.5 | 5 | 8 | 0 |
| 3 | −1 | 4 | 6 | 0 |
| 4 | 0 | 4 | 8 | 0 |
| 5 | −1 | 5 | 10 | 0 |
| 6 | −2 | 1.5 | 10 | 0 |

A negative bias of the source sharpens the electron profile, resulting in a forward bias of the source junction. The source voltage should be less than 0V, preferably between 0V and −2V, more preferably at about −0.5V. The bulk voltage is about 0V or grounded. The drain voltage is positive, preferably between 1.5V and 6V, more preferably at about 4V. The gate voltage is positive, preferably between 6V and 10V, more preferably at about 8V.

TABLE 2b voltage settings for erasing an n-type NROM ™ memory device resulting in charge distribution curves of FIG. 12b

| Curve | source bias $V_s$ (V) | drain bias $V_d$ (V) | gate bias $V_g$ (V) | Bulk bias $V_b$ (V) |
|---|---|---|---|---|
| 1 | 4 | 8 | −2 | 0 |
| 2 | 2 | 7 | −3 | 0 |
| 3 | 0 | 5 | −5 | 0 |
| 4 | 2 | 8 | −2 | 0 |
| 5 | 3 | 9 | −1 | 0 |
| 6 | 0 | 5 | −6 | 0 |

In order to obtain wide hole distribution, the source voltage should be 0V or positive, preferably between 0V and 5V, more preferably at about 3V. The bulk voltage is about 0V or grounded. The drain voltage is positive, preferably between 5V and 10V, more preferably at about 7V. The gate voltage is negative, preferably between —1V and –7V, more preferably at about –3V.

Figure 13A:
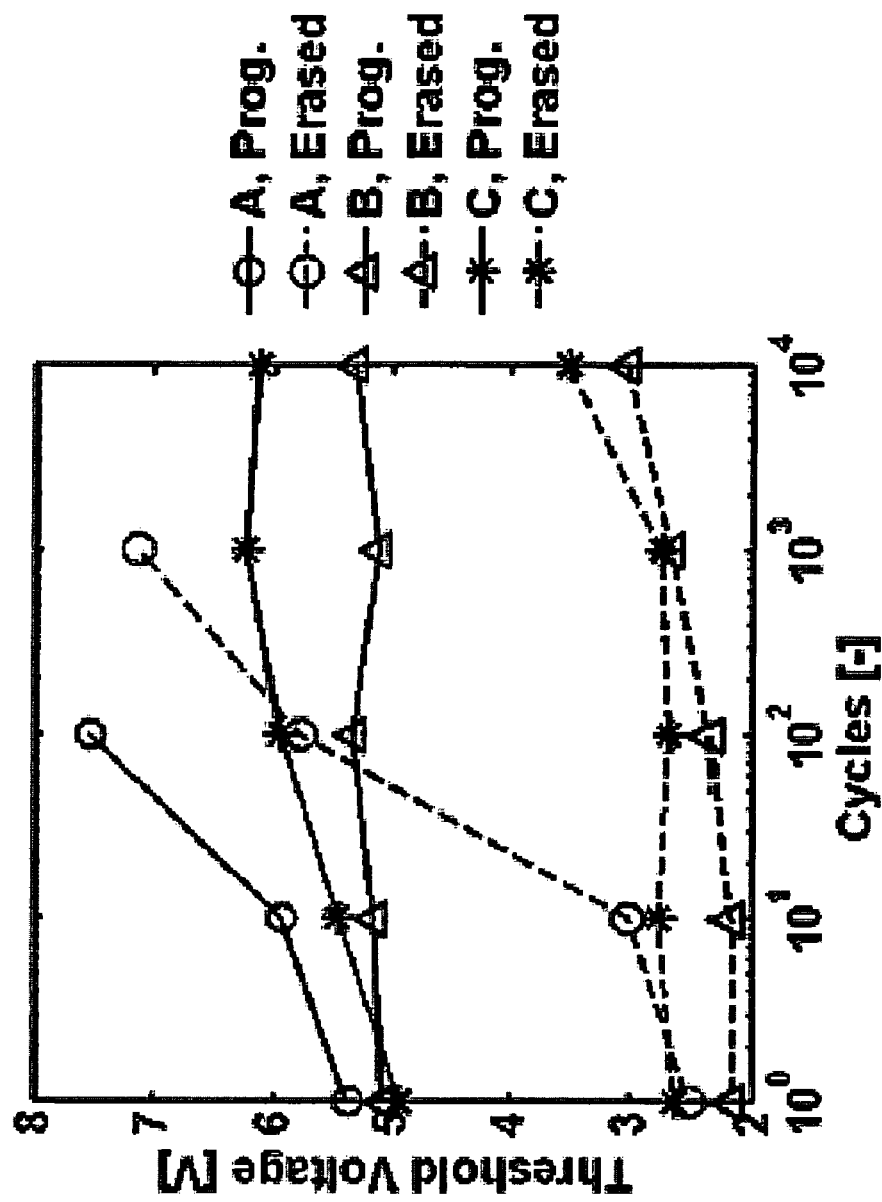
FIGS. 13a-b shows a comparison of the cycling characteristics measured at 150° C. without verify (a) endurance, b) retention) for conventional NROM™ operation conditions (A) and for operation conditions according to exemplary embodiments of the invention (B, C).
Figure 13B:
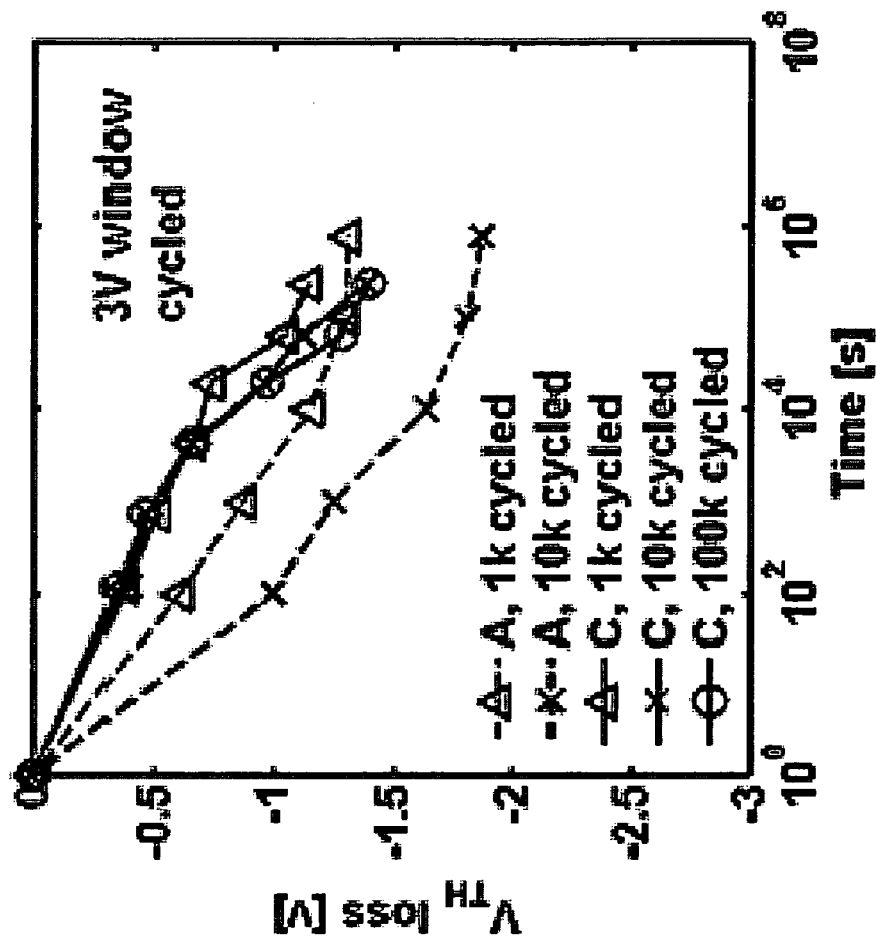

FIGS. 13a-b illustrate further embodiments. 0.11 um wide and 0.24 um NROM™-type memory devices with nitride as charge-trapping layer were manufactured using hot-carrier-injection optimized junctions. The oxide(11)/nitride(10)/oxide(9) layers of the gate dielectric stack (4) have the respective thickness of 8 nm/10 nm/7 nm. The improved endurance and retention characteristics of a memory device by applying the programming and erasing conditions are illustrated in FIG. 13a and FIG. 13b respectively. Conventional NROM™ operation conditions (A) are compared with operation conditions selected as described herein (B, C). These conditions are listed in table 3 below. Even after a large number of cycles the increase in threshold voltage is substantially less than for the conventional NROM™ voltage settings. Although condition B yields the best matching of electron and hole profiles, these settings might not be applicable as the highly forward biased source junction induces a high current through the junction and a slow program operation (20 ms). The condition C also yields a fair match between electron and hole profiles, but the combination of reduced source voltage and increased drain voltage result in less current through the junction and a faster program operation (1 us).

TABLE 3

3 sets of conditions for programming and erasing an n-type NROM ™ memory device resulting in the endurance characteristics of FIG. 13a and in the retention characteristics of FIG. 13b, (us = microseconds, ms = milliseconds)

| | source bias $V_s$ (V) | drain bias $V_d$ (V) | gate bias $V_g$ (V) | bulk bias $V_b$ (V) | Time T |
|---|---|---|---|---|---|
| A program | 0 | 5 | 9 | 0 | 1 us |
| A erase | 0 | 7 | –7 | 0 | 100 us |
| B program | –2 | 1.5 | 10 | 0 | 20 ms |
| B erase | 4 | 8 | –2 | 0 | 10 us |
| C program | –0.5 | 5 | 9 | 0 | 1 us |
| C erase | 3 | 7 | –3 | 0 | 20 us |

As shown in FIG. 13a the endurance is considerably improved by the settings of condition B, while the settings of condition C are a fair compromise between matching and applicability. The threshold voltage during programming is shifted less than 25% after at least 10,000 (10k) cycles when using the settings according to the methods as described herein. The threshold voltage during erasing is shifted less than 100% after at least 100,000 (100k) cycles when using the settings described herein.

FIG. 13b shows the improvement in retention after cycling measured at 150° C. when using the settings of condition C when compared to the conventional settings A. The shift in threshold voltage over time of a memory device that has been cycled a number of times is substantially reduced when using the settings of condition C. Using the settings according to the convention will limit this threshold shift to less than –1.5V or even less than –1V even after one million seconds.

Figure 14:
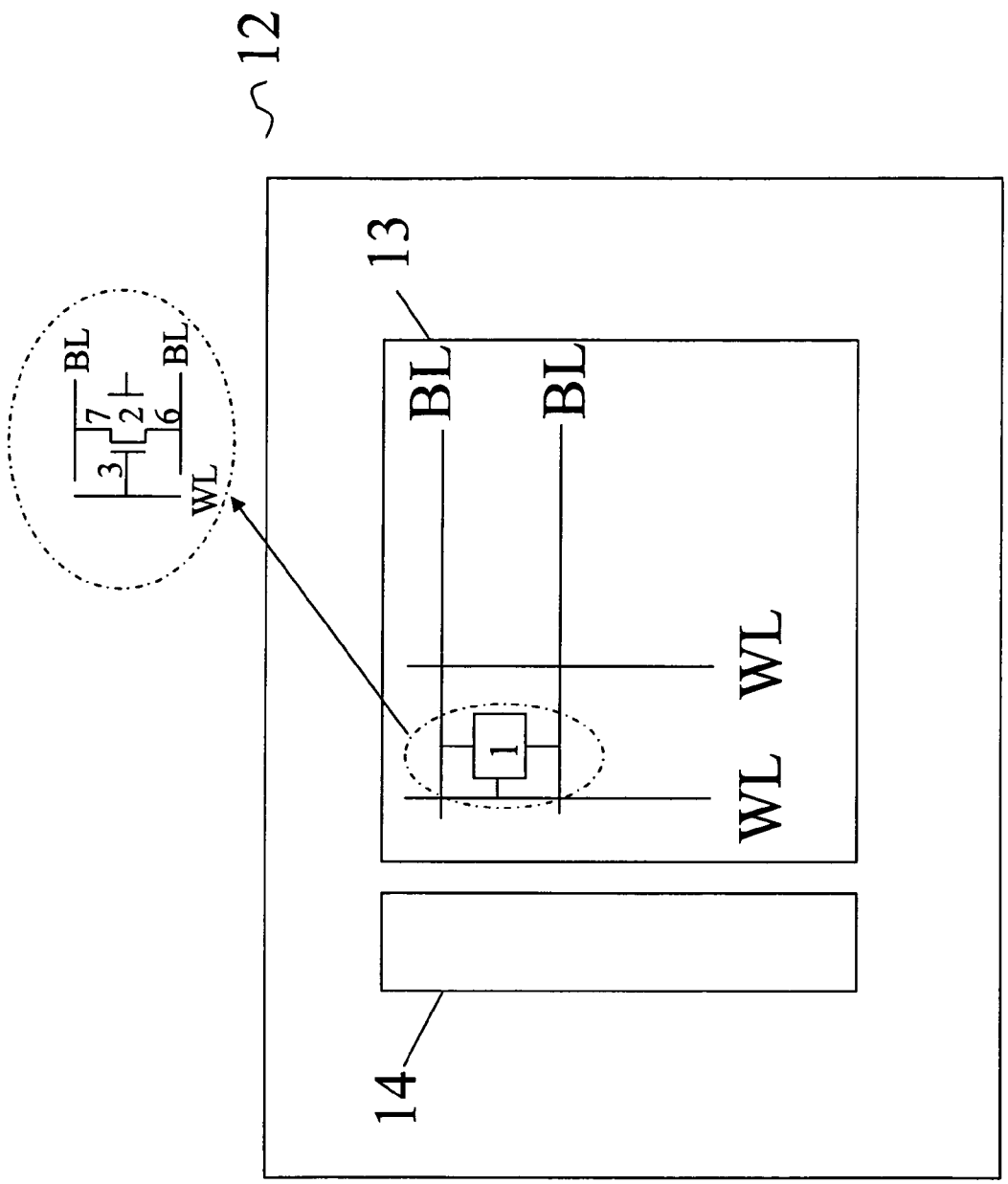
FIG. 14 shows a schematic layout of a memory circuit.

FIG. 14 shows a schematic representation of a memory circuit (12) comprising a matrix (13) of charge-trapping memory devices (1), each memory device comprising a substrate (2) having a source (6), a drain (7) and a channel (8), the channel extending between the source and the drain and underneath a charge trapping layer (10). As shown in the inset of FIG. 14 the source, drain, gate and bulk nodes of the memory device are connected to the interconnect wiring of the memory circuit. In this example source (6) and drain (7) are connected to bitlines BL, the gate (3) is connected to a wordline WL while the substrate is biased to ground as illustrated in FIG. 9b. In this exemplary matrix configuration wordlines WL and bitlines BL are running perpendicular to each-other although a person skilled in the art will appreciate that other matrix configurations of charge-trapping memory devices are known and applicable. The circuit (12) further comprising peripheral circuitry (14) for applying programming and erase conditions to each of the charge trapping memory devices (1) in the matrix, characterised in that the peripheral circuitry comprises means for suppressing secondary first type carrier injection when programming a charge trapping memory device (1) using first type carriers. These suppressing means can further comprise means for forward biasing the source (6)—substrate (2) junction of each of the memory devices (1) upon applying the programming conditions.

The systems and methods described herein thus allow improvement of the characteristics of charge-trapping devices, in particular of NROM™-type memory devices. The dependency of the electron and hole profile on the settings of the program and erase operations for such a memory device can be accurately determined using the charge-pump extraction technique of the first aspect of the invention. Knowing this dependency one can select the settings for the program and erase operations resulting in the desired match of both profiles as done in the second aspect of the invention. These settings can be applied to every memory device that was manufactured in a semiconductor process substantially similar to the process for manufacturing the device used for charactering the carrier profile-voltage dependency. By substantially matching the electron and hole profiles in the charge-trapping layer the endurance characteristics and the retention after cycling of the charge-trapping memory device are substantially improved and there is less need to apply a verify scheme in order to extend the life-time of the memory device.

The invention claimed is:

1. A method for determining a set of programming and erase conditions for operating a non-volatile memory device comprising a charge-trapping layer, comprising:
  a) selecting a set of programming and erase conditions,
  b) programming the device under the programming conditions and determining a first spatial charge distribution of the charge-trapping layer,
  c) erasing the device under the erase conditions and determining a second spatial charge distribution of the charge trapping layer,
  d) determining a first net charge distribution variation profile from the difference between the first and second spatial charge distributions,
  e) programming the device under the programming conditions and determining a third spatial charge distribution of the charge-trapping layer,
  f) determining a second net charge distribution variation profile from the difference between the second and third spatial charge distributions,
  g) checking if the second net charge distribution variation profile is substantially the opposite of the first net charge distribution variation profile, and
  h) if not, optimising the set of programming and erase conditions in step a) and repeating steps b) to g).

2. A method according to claim 1, wherein the first, second and third spatial charge distributions are determined by:
  i) determining a varying base level voltage charge pumping curve, j) determining a varying top level voltage charge pumping curve, k) establishing a relation between a maximum charge pumping current $I_{cp}$ and a calculated channel length $L_{calc}$ of the semiconductor device by reconstructing a spatial charge distribution from the charge pumping curves for multiple values of the charge pumping current $I_{cp}$, l) selecting from the multiple values of $I_{cp}$ the value for which the corresponding calculated channel length $L_{calc}$ is substantially equal to the effective channel length $L_{eff}$ of the semiconductor device, and m) reconstructing the spatial charge distribution from the charge pumping curves using the value of $I_{cp}$ obtained in step l).

3. A method for operating a non-volatile memory device comprising a charge-trapping layer, comprising:

programming the non-volatile memory device by applying predetermined programming conditions, such that carriers of a first charge type are injected into the charge-trapping layer, resulting in a first net charge distribution variation profile, and erasing the non-volatile memory device by applying predetermined erase conditions, such that carriers of a second charge type are injected into the charge-trapping layer, resulting in a second net charge distribution variation profile, wherein the predetermined programming and erase conditions are chosen such that the first net charge distribution variation profile is substantially the opposite of the second net charge distribution variation profile; and wherein the predetermined programming and erase conditions are determined by a method comprising:

a) selecting a set of programming and erase conditions, b) programming the device under the programming conditions and determining a first spatial charge distribution of the charge-trapping layer, c) erasing the device under the erase conditions and determining a second spatial charge distribution of the charge trapping layer, d) determining a first net charge distribution variation profile from the difference between the first and second spatial charge distributions, e) programming the device under the programming conditions and determining a third spatial charge distribution of the charge-trapping layer, f) determining a second net charge distribution variation profile from the difference between the second and third spatial charge distributions, g) checking if the second net charge distribution variation profile is substantially the opposite of the first net charge distribution variation profile, and h) if not, optimising the set of programming and erase conditions in step a) and repeating steps b) to g).

4. A method for operating a non-volatile memory device according to claim 3, wherein the first type carriers are electrons and that the predetermined programming conditions are chosen such that secondary electron injection is suppressed.

5. A method for operating a non-volatile memory device according to claim 3, wherein the first type carriers are holes and that the predetermined programming conditions are chosen such that secondary hole injection is suppressed.

6. A method for operating a non-volatile memory device according to claim 3, characterised in that the non-volatile memory device comprises a substrate having a source, a drain and a channel, the channel extending between the source and the drain and underneath the charge trapping layer, and in that the secondary electron injection is suppressed by means of a predetermined voltage difference between the drain and the substrate.

7. A method for operating a non-volatile memory device according to claim 3, wherein the first, second and third spatial charge distributions are determined by:

i) determining a varying base level voltage charge pumping curve, j) determining a varying top level voltage charge pumping curve, k) establishing a relation between a maximum charge pumping current $I_{cp}$ and a calculated channel length $L_{calc}$ of the semiconductor device by reconstructing a spatial charge distribution from the charge pumping curves for multiple values of the charge pumping current $I_{cp}$, l) selecting from the multiple values of $I_{cp}$ the value for which the corresponding calculated channel length $L_{calc}$ is substantially equal to the effective channel length $L_{eff}$ of the semiconductor device, and m) reconstructing the spatial charge distribution from the charge pumping curves using the value of $I_{cp}$ obtained in step l).

* * * * *